United States Patent [19]

Austin

[11] Patent Number: 4,935,734

[45] Date of Patent: Jun. 19, 1990

[54] SEMI-CONDUCTOR INTEGRATED CIRCUITS/SYSTEMS

[75] Inventor: Kenneth Austin, Northwich, United Kingdom

[73] Assignee: Pilkington Micro-Electronics Limited, Merseyside, England

[21] Appl. No.: 905,777

[22] Filed: Sep. 10, 1986

[30] Foreign Application Priority Data

Sep. 11, 1985 [GB] United Kingdom ............... 8522534
Oct. 23, 1985 [GB] United Kingdom ............... 8526143
Jul. 19, 1986 [GB] United Kingdom ............... 8617705

[51] Int. Cl.$^5$ ..................................... H03K 19/173
[52] U.S. Cl. ........................... 340/825.83; 340/825.86; 340/825.87; 307/465
[58] Field of Search ...................... 340/825.86, 825.83, 340/825.84, 825.88; 307/445, 465; 365/961, 103; 364/716

[56] References Cited

U.S. PATENT DOCUMENTS

| | | | |
|---|---|---|---|
| 3,573,488 | 4/1971 | Beelitz | 307/467 |
| 3,936,812 | 2/1976 | Cox | 365/63 |
| 4,161,662 | 7/1979 | Malcolm | 307/465 |
| 4,307,379 | 12/1981 | Wyland | 340/825.86 |
| 4,458,163 | 7/1984 | Wheeler et al. | 367/716 |
| 4,551,814 | 11/1985 | Moore et al. | 307/465 |
| 4,554,640 | 11/1985 | Wong et al. | 340/825.83 |
| 4,564,773 | 1/1986 | Tanizawa et al. | 307/445 |
| 4,583,193 | 4/1986 | Kraft et al. | 364/716 |
| 4,642,487 | 2/1987 | Carter | 307/465 |
| 4,684,830 | 8/1987 | Tsui et al. | 340/825.83 |
| 4,691,161 | 9/1987 | Kant et al. | 307/465 |
| 4,700,187 | 10/1987 | Furtek | 340/825.83 |

FOREIGN PATENT DOCUMENTS

| | | |
|---|---|---|
| 0073641 | 3/1983 | European Pat. Off. . |
| 0098163 | 1/1984 | European Pat. Off. . |
| 0121424 | 10/1984 | European Pat. Off. . |
| 0177261 | 4/1986 | European Pat. Off. . |
| 0204034 | 12/1986 | European Pat. Off. . |
| 2374817 | 7/1978 | France . |
| 1473028 | 5/1977 | United Kingdom . |
| 1600623 | 10/1981 | United Kingdom . |
| 2089160 | 6/1982 | United Kingdom . |
| 2171546 | 8/1986 | United Kingdom . |

OTHER PUBLICATIONS

*Introduction to Switching Theory and Logical Design*, 3rd edition; Frederick J. Hill et al.; pp. 202-204, 1981.
*AMPAL 22V10, 24 Pin IMOX ™ Programmable Array Logic Advanced Micro Devices*; Advanced Micro Devices, Inc.; pp. 1-11; Jun. 1983.

*Primary Examiner*—Douglas W. Olms
*Assistant Examiner*—Ralph E. Smith
*Attorney, Agent, or Firm*—Willian Brinks Olds Hofer Gilson & Lione

[57] ABSTRACT

Configurable semiconductor integrated circuits as-made each have a plurality of logic circuits formed at discrete sites. For each logic circuit, direct selectably conducting/non-conducting connection paths extend from its output to input of a first set of other logic circuits and to its inputs from outputs of a second set of other logic circuits. All of the sets for all of the logic circuits are each different. Other direct connection paths are selectably connectable to inputs and outputs of the logic circuits. Selection can be irreversible or reversible and involves coincident signal addressing of the sites and coded configuring of the paths at that site. Reversible selection can be via field effect transistors or bipolar transistors and can be at or near normal logic signal levels and speeds. Versatile configurable input/output arrangements are described also reconfigurable data processing systems using the reversible transistor provisions.

46 Claims, 19 Drawing Sheets

SEMI-CONDUCTOR INTEGRATED CIRCUITS/SYSTEMS

BACKGROUND OF THE INVENTION

This invention relates to semiconductor electronic integrated circuits (chips) of the type comprising configurable logic circuit arrays, and systems utilising them.

Two types of such circuits are available at present. One type is the so-called uncommitted logic array (ULA) in which a chip is first made with unconnected logic gates, i.e. each isolated at its own site on the chip, and interconnection for particular purposes is achieved by means of a specially configured metallisation layer applied later. Usually, the gate sites are substantially uniformly distributed over the usable area of the chip or at least a central part of such area. Currently, ULAs are available with from 500 to 5000 gates available and will doubtless increase in gate capacity as technology develops. Typically, around 60%-80% of available gates are utilised after interconnection to configure a ULA for a particular purpose, it being in the nature of electronic circuit/system design that various local configurations of interconnected gates perform particular functions and are further interconnected for overall circuit/system requirements, leaving some gates unused. Designing masks for such customised metallisation layers is time-consuming and expensive. Also, it is highly intolerant of errors as remasking is necessary whenever prototypes malfunction by reason of design fault.

The other type is the so-called programmable gate array (PGA) in which a chip is formed with logic gates of which all or most are each individually interconnected with all or most of the others in most if not all conceivable ways. The PGA as made is configured by fusing out unwanted ones of the interconnections. Usually, the gates are formed at edges of the usable area of the chip or that part dedicated to PGA gate purposes, and a more central part of such area is occupied by a grid of interconnections fusible at crossing points or connecting devices. Not surprisingly, gate capacities are very much lower than for ULA's, often effectively about 50 gates or less in terms of inclusion in actual logic functions. The capability of PGA's in terms of putting complex electronic circuit/systems into integrated circuit form is correspondingly limited compared with ULA's. However, PGA's do have a very considerable advantage to the circuit designer, who need only take up another chip and start again whenever an error is made or malfunction is encountered requiring re-design.

It would manifestly be of great advantage and practical utility to have configurable integrated circuits with greater gate capacity than such PGA's (say at least an order of magnitude greater if not approaching the gate capacities of ULAs), but retain the ease of designer-use and freedom from masking-up costs that characterise PGAs compared with ULAs. It is towards providing such semiconductor integrated circuits that this invention first directs its attention.

Several aspects of this invention arise in relation to the teaching hereof, and one aspect can be viewed as starting from questioning the hitherto-accepted practice in relation to PGAs for all gate interconnection possibilities to be provided as-made and before configuration.

According to that aspect of this invention, a configurable semiconductor integrated circuit (chip) as-made has formed therein a plurality of logic circuits at discrete sites and a restricted signal translation system between inputs and outputs of said logic circuits affording direct connection paths between each of said logic circuits and only a few others of said logic circuits, which connection paths are selectable as to their conduction state. Indirect connections to further of said logic circuits are available through one or more others of said other logic circuits.

Suitable said selectable connection paths extend, for each logic circuit, from output thereof to inputs of a first set of others of said logic circuits, and to inputs thereof from outputs of a second set of others of said logic circuits, all of the sets (for all of the logic circuits) each being unique. Normally, first and second sets associated with a particular logic circuit will have at least one said other logic circuit in common and most often at least one each not in common. Generally, each set will usually be a small proportion, less than 5%, of the total number of logic circuits. It is envisaged that in many embodiments the number of logic circuits in a set will be 10 or less. Conveniently, the number in a set may be as small as five, but at least three except at edges of an array.

The term "as-made" as used herein means the chip (or some part thereof) in the state in which it is manufactured and prior to any operation to effect configuration. The term "selectable" as used herein in relation to a connection path comprehends that the condition of the path as to whether or not it conducts in order to transmit electrical signals can be determined relative to its as-made condition by application of appropriate selection signals or signal conditions. The term "logic circuit" as used herein is not intended to be restricted to the single function logic gates (such as NAND) used in illustrated embodiments, in fact could cover any logic circuit whose use with interconnect provisions hereof proves to be feasible.

The direct connection paths are normally between physically neighbouring logic circuit sites, which, whilst not essential, facilitates establishment of a desired particular circuit function in a localised configuration of logic circuits, i.e. in part only of the chip area occupied by an appropriate number of discrete sites of the logic circuits and by the direct connection paths. Interconnections between such localised configurations for overall circuit/system requirements can be either simply by said direct connection paths or by said indirect connections through selected ones of the logic circuits. The inclusion of one or more logic circuit transit times in some actual configured indirect connections is usually of small significance as such need not exceed about 3 nanoseconds on present-day technology, at least for simple logic gate circuits.

We shall describe conduction selection provisions for the direct connection paths at inputs to the logic circuit sites, i.e. in relation to said second set of paths as entering the site. However, they could equally well be provided elsewhere, for example at logic circuit outputs, particularly in branches therefrom (i.e. in relation to said first set of paths as leaving the site), or at combinations of inputs and outputs of logic circuit sites.

Concerning said direct connection paths and appropriate physical dispositions of logic circuit sites on a chip, it is convenient to consider matters in logic diagram terms correlating each logic circuit site as viewed on the surface of a chip of semiconductor material with a logic circuit symbol. The symbols/sites will usually be arranged in an overall disposition of discernable regularity or pattern with spaces between those logic circuit symbols/sites carrying said direct connection paths. Examples of such regularity or pattern are matrix arrays though there may well be offsets or staggers of logic circuit sites in and/or between rows and/or columns. Such logic circuits may "point" in different directions reflected on the area of the chip as sites being oppositely formed in terms of access to inputs and outputs (or considering their outputs as establishing a direction after the manner of an arrow-head). Several alternative dispositions of logic circuits, and their sites are indicated with reference to the drawings, and others may be equally or more efficient or effective, at least in particular circumstances.

A presently preferred disposition in a basic row-and-column, matrix-like, array, has each of its logic circuits in each row "pointing" in one direction and connected by a selectable connection path from its output to input of the next following logic circuit in the row. Further preferably, such directions of successive rows alternate thus making overall zig-zag or snake-like indirect paths available throughout. Further preferably, such logic circuit outputs are selectably connected to inputs of the next adjacent logic circuits in the same columns, i.e. those in the next adjacent rows. That makes available paths running along columns, respectively. Overall, such a disposition gives flexibility of selectable direct connections between neighbouring logic circuits in a compact overall arrangement of logic circuit sites. Such flexibility of interconnection is extendable in a particularly advantageous way by a further selectable direct connection path from output of each logic circuit to input of the next-but-one logic circuit in the same row going in the same direction as the direct connection to the next logic circuit.

The words "row" and "column" will usually have some perceptible reflection in actual dispositions of logic circuit sites on a chip but are used herein mainly for ease of explanation, i.e. not for necessarily implying exactitude of logic circuit site lay-out/topography. It should, however, be clear that all embodiments of this invention are intended to permit selection of connection paths for configuration purposes relative to logic circuit site dispositions that can be substantially uniformly disposed over at least part of the relevant area of a chip.

There is another aspect of this invention concerning selectable connection provisions traversing chip area of prime capability for formation of logic circuit sites.

According to that aspect a configurable semiconductor integrated circuit (chip) as-made has a plurality of logic circuits formed therein distributed over at least part of its usable area, and a direct signal translation provision comprising at least one conducting path associated with selectable connection paths for inputs and outputs of said plurality of logic circuits or at least one subset thereof. Such path or paths can be wholly or mainly in and along spaces between discrete sites of said logic circuits with selectable branch paths into those sites. This provision is called herein a direct connect bus system whose paths traverse more of the logic gate sites than can be reached by the first-discussed direct connection paths.

Whilst obviously applicable alone, this aspect has particular advantage when employed in conjuction with the direct connection paths of said restricted signal translation system in order to provide selectable other direct connections between non-neighbouring logic circuit sites. Such provision avoids logic circuit transit times of said indirect connections and allows direct connections between groups of sites in different regions of said area. Dedicated such other conducting paths can extend along rows and columns of a matrix array of logic circuits. Branches to two dedicated inputs at each logic circuit site can then be selectable, as can further preferred branches from each logic circuit output. Conections by way of such direct connect bus connection paths can go along selected rows or columns and from one to another thereof in any desired way, including providing disconnected segments. It is not necessary for the conducting paths of such a direct connect bus system all to be metallised as at least parts may be paths through host semiconductor material of enhanced conductivity, for example polysilicon for silicon host material. Also, neither direction of row and column conducting paths need extend continuously over the whole array of logic circuit sites. They can be confined to a subset of the logic gates of the array, or be provided localised to each of several subsets. Any necessary further interconnection relative to the subsets can be through a logic circuit or circuits.

It can be advantageous for segmented sections of such paths, which may correspond to different subsets, to overlap each other by at least one logic circuit site. Segmented provisions are particularly useful for conductivity-enhanced paths or parts of paths as they should then be of limited extent, say up to six logic circuit sites, in view of their greater impedance compared with metallised paths. For example, the row-following paths could be metallised, perhaps interrupted once with possible interconnection through a logic circuit, whilst the column-following paths could be of polysilicon in much shorter interleaved and overlapped lengths and also interconnectable by means of logic circuits.

It is found convenient for all selection provisions of input connection paths to a particular logic circuit, and any selection provisions of output connection paths therefrom, to be adjacent to that particular logic circuit, and thus be considered as included in the logic circuit site.

To provide for selective addressing of logic circuit sites, (in relation to configuring selectable connection paths to their inputs or from their outputs), spaces between them can be further traversed by specific row and column extending conducting paths (address paths). The latter conveniently enter the site of each logic circuit through branches from each of corresponding row and column address paths, and have associated further circuitry to serve in affording (by coincident energisation) circuit conditions contributing to selection of required selectable connection paths, for example establishing voltage levels assuring required response to an actual configuring signal.

For configuring addressed logic circuits in relation to their selectable and desired connection paths, it is further an aspect hereof that a configuring (program) bus system is provided having a number of (program) conducting paths corresponding to the maximum number of selectable connection paths in any of the logic circuit sites. The program conducting paths traverse (usually between but branched into) all of the logic circuit sites and operate at least to complete circuit conditions required for configuration, usually to deliver configuring electrical signals.

Then, the address paths can condition all of the selectable paths at logic circuit sites as selected sequentially, and, at each site in turn, the program paths cooperate to effect the required configuration by changing the conduction state of appropriate selectable connection paths. For the purposes of selectability, circuit elements are provided, one per selectable connection path, and the as-made conduction state of those circuit elements can be changed by a said configuring electrical signal or circuit condition.

An alternative is for more address paths to go to each logic circuit site and to have coded connections relative to the selectable connection paths at that site so as sequentially to achieve at least conditioning of a different one or more (less than all) of the selectable connection paths.

That leads to provision of two or more of each of row and column address paths, but to a reduction in the number of program paths required. Each of the reduced number of program paths will service more than one of the selectable connection paths at each logic circuit site but only one of them will be conditioned at any one time by the address paths. Where there are enough address paths to identify each selectable connection path at each site, the program paths could be replaced by a single configuring signal path, otherwise enabling of address path energisation could be on a selective basis if such energisation is enough also to achieve circuit conditions causing configuration automatically.

At least where the circuit elements of the selectable connection paths are normally conducting in the chip as-made, and to be rendered irreversibly non-conducting, they can comprise what we call conducting links, whether of fusible conductor or of other disablable type (say a diode to be "blown"). Associated further circuitry will normally include an active circuit device conditioned to pass a disabling electric current as a said configuring signal. Otherwise, blocking signals might be used for controlling current steering means (of said further circuitry) by which disabling current flow will otherwise be applied to each of those circuit elements of the addressed logic circuit site whose steering means is not blocked.

An alternative to fusible or otherwise irreversibly disabled conducting links comprises switchably conducting/non-conducting circuit elements, typically active circuit components, for example transistors. Then, signals on the address and program paths, or coded address paths only, can be used to provide suitable conditions for setting the reversible conduction state of those circuit elements. Typically, active circuit devices (for example also transistors) of associated further circuitry are in suitable circuit configuration with the selectably conducting/non-conducting circuit elements to condition the latter for conduction. Some embodiments of this invention will have configured conduction states that, in operation, remain until reconfigured (static) and other embodiments will require refreshing of their configured conduction states (dynamic).

For CMOS integrated circuit technology, charge-trapping transistors, for example floating gate transistors or oxide-nitride sandwich transistors, can set up selected conduction states that are static for associated selectable connection paths in a manner somewhat analagous to that used in relation to EPROMs. Here, though, such charge-trapping transistors are used to control circuit elements comprising normal MOS transistors, specifically to determine whether those MOS transistors are to be conductive as selectively configured.

An alternative would be to establish such control conditions by way of combinations of MOS transistors and capacitors in a manner analagous to that used in relation to so-called dynamic read/write memories (DRAMS), but then, of course, requiring refreshing, i.e. on a dynamic basis.

A significant development concerning use of single signal-pass field-effect transistors as selectable connection-controlling circuit elements is the subject of another patent application.

Basically, in a field effect semiconductor chip, a single signal-pass transistor is connected between bit signal input and bit signal output and has its control electrode connected for temporary energisations by switching circuitry operative only at prescribed intervals, the single signal-pass transistor being operative to pass signals between such energisations of its control electrode. Those energisations render the single signal-pass transistor conductive, i.e. enabled for conduction, and that conduction is caused to persist, though with some decay, hence periodic refreshing at said prescribed intervals. Inherent capacitance of the single signal-pass transistor inevitable results in accumulation of charge during each said energisation applied to its control electrode. The switching circuitry operates, not to apply discharge voltage between such energisations at said prescribed intervals, but rather to leave the control electrode "floating" between refreshes by said energisations. Such single signal-pass transistors are, of course, capable of continuous signal passage despite only intermittent energisation of their control electrodes.

We further propose an alternative single signal-pass transistor for bipolar semiconductor chips, which will also operate at or near normal logic voltage levels and speeds, and do so without requiring refreshing. That proposal involves circuit formations resembling, at least in action, a silicon-controlled-rectifier (SCR) associated with another transistor for selection to condition for triggering that will force the single signal pass transistor into conduction until reset or loss of power supply. At least for a NAND gate, the signal-pass transistor can effectively be an input stage of the gate.

It should be evident that envisaged alternatives to irreversibly fusible or disabled links or parts, indeed all feasible reversible conduction schemes/devices lead to integrated circuits of this invention that are reconfigurable.

Amongst important implications is the possibility of re-using the same chip, whether by a designer in prototyping or developing a particular system/function, or by a manufacturer to adjust his inventory. Chips employing charge-trapping transistors could be reconfigured by suitable equipment, for example an EPROM writer, whether working from a model or master chip or from the contents of some store that could be part of a programmed computer system serving as a design terminal and/or library of available configurations. Any such applied configuration will be static, i.e. not require refreshing, but configuration will usually be much slower and require much higher signal levels than appies to its subsequent operation as a configured logic system. That would militate against reconfiguration in actual use, though EEPROM chip development may make that feasible.

However, there is the possibility of reconfiguring at or near normal logic signal levels and speeds, which would apply to the afore-mentioned chips using DRAM- type MOS transistor/capacitor combinations, and is yet more efficiently achieved by our single signal pass transistor proposals. Such chips of field effect type are generally of a dynamic nature requiring refreshing of any resident configuration, but bipolar chips can be of a static nature using our SCR-related proposal.

SUMMARY OF THE INVENTION

Reconfigurability underlies other aspects of this invention, i.e. regardless of whether the reconfigurable chips are as envisaged herein or whether they are of some other design and implementation.

According to such an aspect of this invention an electronic system utilising a reconfigurable chip further comprises means for presenting to that chip, whenever configuration is required, electrical input signals defining the then-desired configuration. Such electronic systems will normally be digital, and can include means for utilising signals from the chip, preferably also means for presenting signals to the chip.

Defining signals may be presented according to the contents of a store system, whether permanent or semi-permanent or temporary according to the state of a computer or other data processing system. However, any source of defining signals can be used.

Using one or more reconfigurable chips, at least a part of an overall electronic system can have a reconfiguration capability, whether as alternative back-up configurations for one or more particular functions, or as alternative functions not required together, or some combination of both. For alternative functions the presenting means may include a sequencer, say in association with appropriate store system addressing means. Parts of chips hereof might well be configured as addressing means to serve in successive reconfigurations thereof, especially from a specific associated store, preferably a RAM.

Reconfiguring of chips at or near normal logic signal levels and speeds could provide an electronic system with fewer chips because at least some of them can be reconfigured to take on a sequence of at least two functions that would otherwise require separate chips but whose functions are not actually required simultaneously. Also, any desired number of reconfigurable chips can be configured together for desired serial processing, or to perform parallel processing. The latter could be on parts of the same algorithm or function, say with different start points of a spectrum of data for investigation by that algorithm or function, thereby effectively multiplying the rate of operations performed per unit of time. Such systems may conveniently have reconfigurable chips on the same printed circuit board also having address/data bus systems. Each chip can have a store, usually RAM associated therewith. The data proceeding power of such a system can be very high for very low cost.

At least where any one chip to be configured essentially to a particular purpose is capable of alternative possible configurations to the same purpose, i.e. for reconfiguration in the event of failure of the current configuration, same may be done on an automatic basis according to results of test procedures/functions that may be externally applied and controlled or, advantageously, incorporated onto the chip concerned or at least its associated store.

At least in connection with reconfigurable chips, it has been found advantageous to make special provisions on the chips regarding input/output. Various features thereof include:

(a) providing, for edge-most configurable logic circuit sites, input/output circuitry as peripheral cells that afford multiple access between actual edge pins or pads for input/output signals and a greater number or input/output lines of the edge-most logic circuit sites, preferably both to one input of each edge-most logic circuit site and from its output, though it is advantageous for each of the latter to serve a dual purpose in being further connected to inputs of the next in-array ones of the logic circuit sites;

(b) providing that at least some individual subcells of such peripheral cells are configurable and reconfigurable to serve input or output purposes, conveniently correlated at least with lines that can serve as output from edge-most logic circuit sites and input to next edge-most logic circuit sites, and preferably further affording signal transmission from and back to the logic circuit sites;

(c) providing for multiple connections of input/output lines of logic circuit sites to subcells on an efficient and orderly basis;

(d) providing a peripheral cell of such subcells on each of at least two sides, preferably all four, of a physically rectangular array of logic circuit sites;

(e) providing side-wise extending conducting paths outside peripheral cells which paths afford alternative connections from edge pins or pads to peripheral cells at adjacent sides.

It may well be that other features or combinations of features will prove to be both novel and useful, in which case same are further to be considered as inventive aspects.

BRIEF DESCRIPTION OF THE DRAWINGS

Specific implementation of this invention will now be described, by way of example, with reference to the accompanying diagrammatic drawings, in which.

Figure 1:
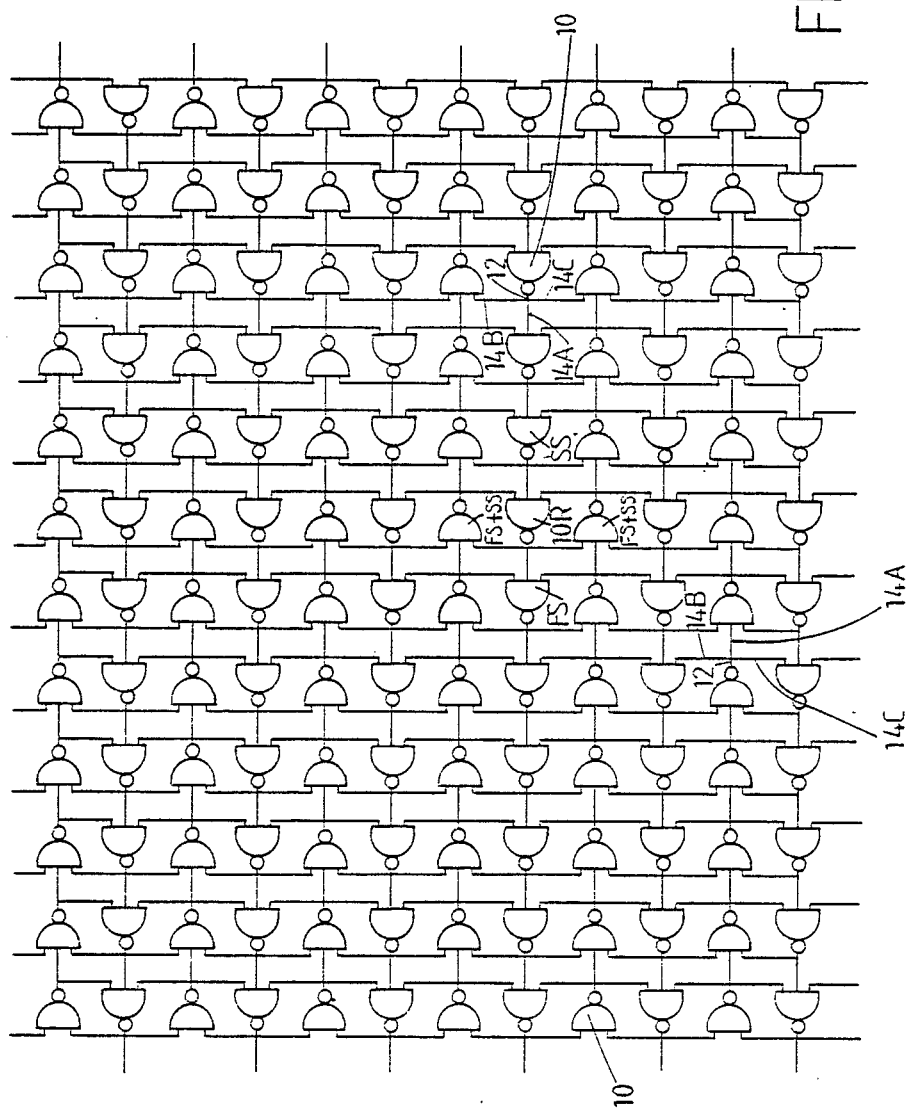
FIG. 1 shows a basic logic circuit array layout, actually of NAND gates.

In the drawings, we show NAND gates as the aforesaid logic circuits, but that should not be taken as limiting.

DESCRIPTION OF THE PREFERRED EMBODIMENT

Referring first to FIG. 1, a semiconductor chip as-made will have an area thereof carrying a matrix array of NAND gates 10 at discrete sites. For clarity of illustration, the matrix array as shown is small compared with a normal actual layout, which can extend to thousands of gate sites. As-made, the chip also has direct gate connection paths 14. For each gate in rows and columns other than those at edges, its output 12 is directly connected at 14A to input of the next gate in nose-to-tail serial fashion along rows. Output 12 is further connected at 14B, 14C to inputs of gates that with its gates disposed nose-to-tail serially in the opposite direction. Each of the direct connection paths 14A, B, C is of conduction-selectable type. Gates at ends of rows and columns have direct connection paths so far described, and unused connection paths can serve for data input and output for the array of gates.

Figure 2:
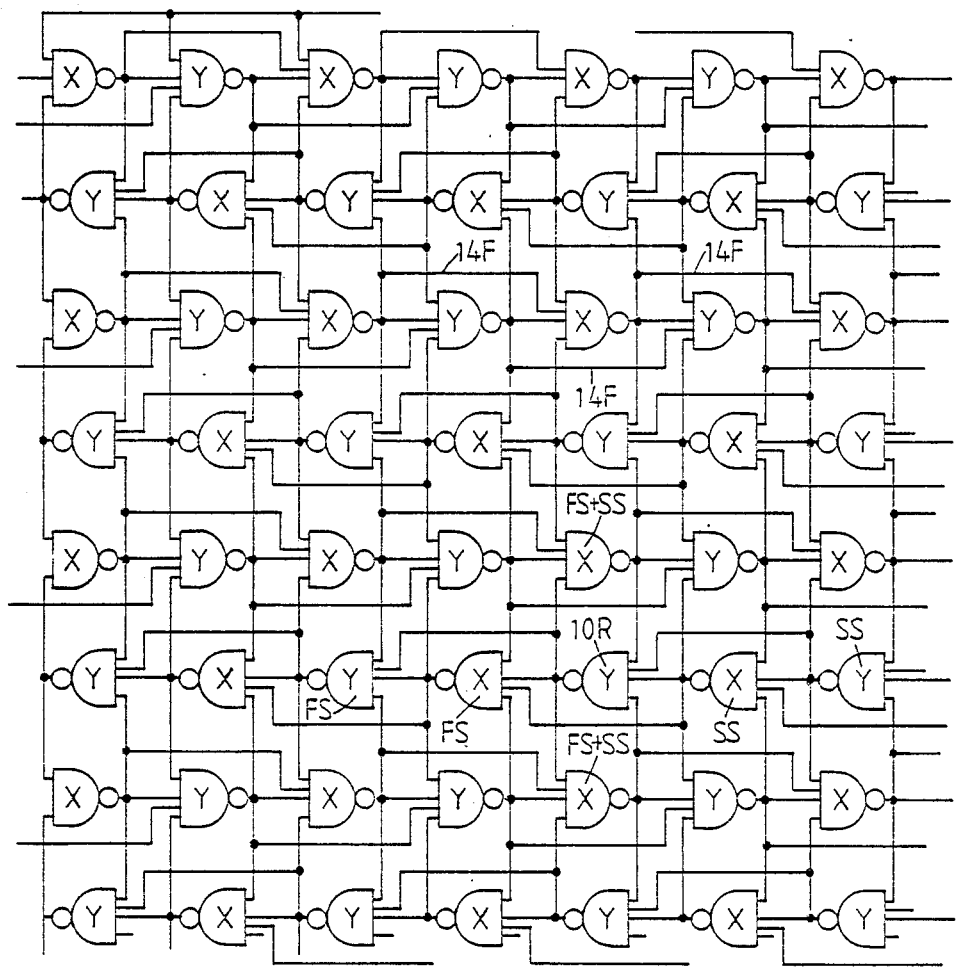
FIG. 2 shows a variant gate layout with an extra direct gate connection.

FIG. 2 shows the same basic gate array layout connection of its output to input of the next but one gate in its row, shown as selectable connection path 14F.

Considering each gate as directly connected by other gates, and by paths between its inputs and outputs of a second set of other gates, no gate has less than one other gate in common between those sets, and at least one other gate not common. In fact, in FIGS. 1 and 2, all but those at edges of the array gates have at least three gates in each in each of its sets, of which two are common to both sets and one (FIG. 1) or two (FIG. 2) of each set are not. The common gates actually share the same column as the gate concerned and the others share the same row. First (FS) and second (SS) sets are shown for one gate (10R) in FIGS. 1 and 2.

The arrangement of FIG. 1 is particularly compact, and is readily implemented using one metallisation layer. The enhancement of FIG. 2 is powerful in extending the flexibility of direct connection selection in arriving at logic-function-performing interconnections of gates on a local basis, but does require "crossovers". As applies throughout this description, "crossovers" can be obtained by more than one metallisation, or by appropriate combination of metallisation and conductivity-enhanced semiconductor material, say polysilicon for silicon chips.

Alternative enhancements of the direct connection paths of FIG. 1, could involve direct connection paths from each gate output to input of a gate in the next column but next-but-one row. That generally involves one less cross-over than FIG. 2 but is obviously less powerful in going along rows where the "hopping" effect of the FIG. 2 layout is particularly effective. Direct connection of gate outputs to inputs of the next gate in the same row is considered particularly powerful, but may not always be essential. Another possibility has other direct connection paths going to gates in next adjacent rows but the next column, mainly to get improved diagonal interconnections over the chip.

Alternative dispositions of gates include adjacent pairs of rows "pointing" in one direction but adjacent pairs "pointing" in opposite directions. One direct connection path scheme again had gate outputs connected to input of the next gate in the same row, and two other direct connections to the next but one gates in the same column. That made logic function interconnections of gates less localised in themselves, though they can be at least partly interleaved as the overall gate layout resembles two diagonally offset or intercalated layouts of FIG. 1. An alternative for the same gate layout is for gate outputs to be connected to inputs of next gates in the same column, giving alternate encouragement of different directions of interconnection.

At least for certain types of logic function design, other gate layouts can be with not all gates in the same direction in each row, and can use other provisions of selectable direct connections.

It will be appreciated from the foregoing, that local direct connection paths (14A, B, C, F) do allow for indirect connections between different parts of the array of gates 10 on the basis of selective traversal of gates 10 then acting simply as inverters, i.e. with their other connections non-conducting. Such use of gates in indirect connections does not normally represent any significant reduction of gate utilisation relative to ULAs as the latter normally use only 60%–80% of gate capacity, and the unused gates are inevitably normally close to and between parts of the array configured, respectively, to perform particular constituent functions or subfunctions.

Figure 5:
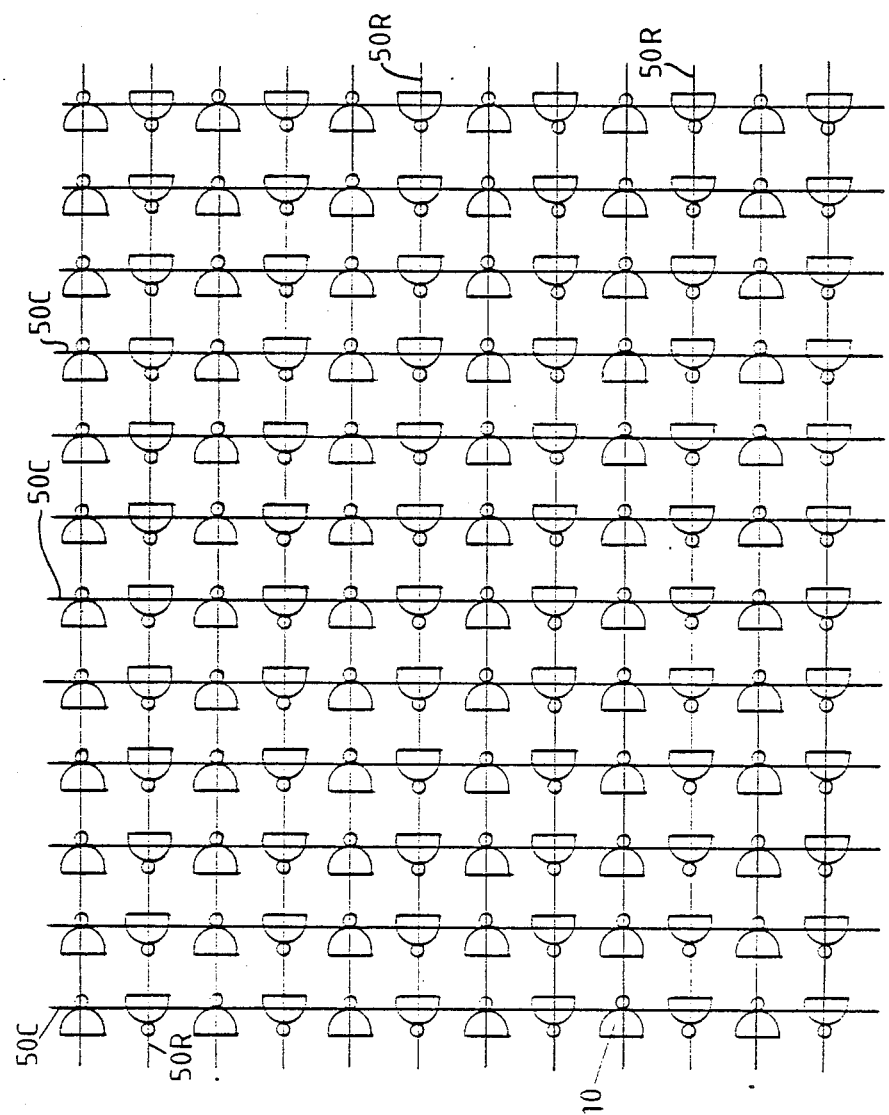
FIG. 5 diagrammatically adds to FIG. 1 a direct connect bus system layout.

However, referring to FIG. 5, it is the case that the preferred embodiments hereof further include another signal translation system, by way of a direct connect bus directly connected to gates 10 throughout the array. That is done using a grid of other connecting paths, see row and column conductors 50R, 50C going to each gate site in the corresponding row or column thereof. They utilise (FIG. 7) other dedicated selectable connection paths, shown as inputs 14D, 14E of the gate sites 10S (or gates 10 in FIG. 8), from branches 52R, 52C of such conductors 50R, 50C. In addition (FIG. 7), output 12 of each gate 10 can be branched at 52G, 52H back to the conductors 50R, 50C and that will then be through other selectable connection paths.

The direct connect bus system 50 does not have to be continuously coextensive with the entire area of the chip occupied by gates 10. Indeed, it is preferably not so where any part of row and/or column paths 50R, 50C are through conductivity-enhanced semiconductor material rather than along metallisation. For silicon chips of 3-micron MOS type, it is found advisable not to have extents of polysilicon beyond that required to traverse six row or column gates.

Figure 6:
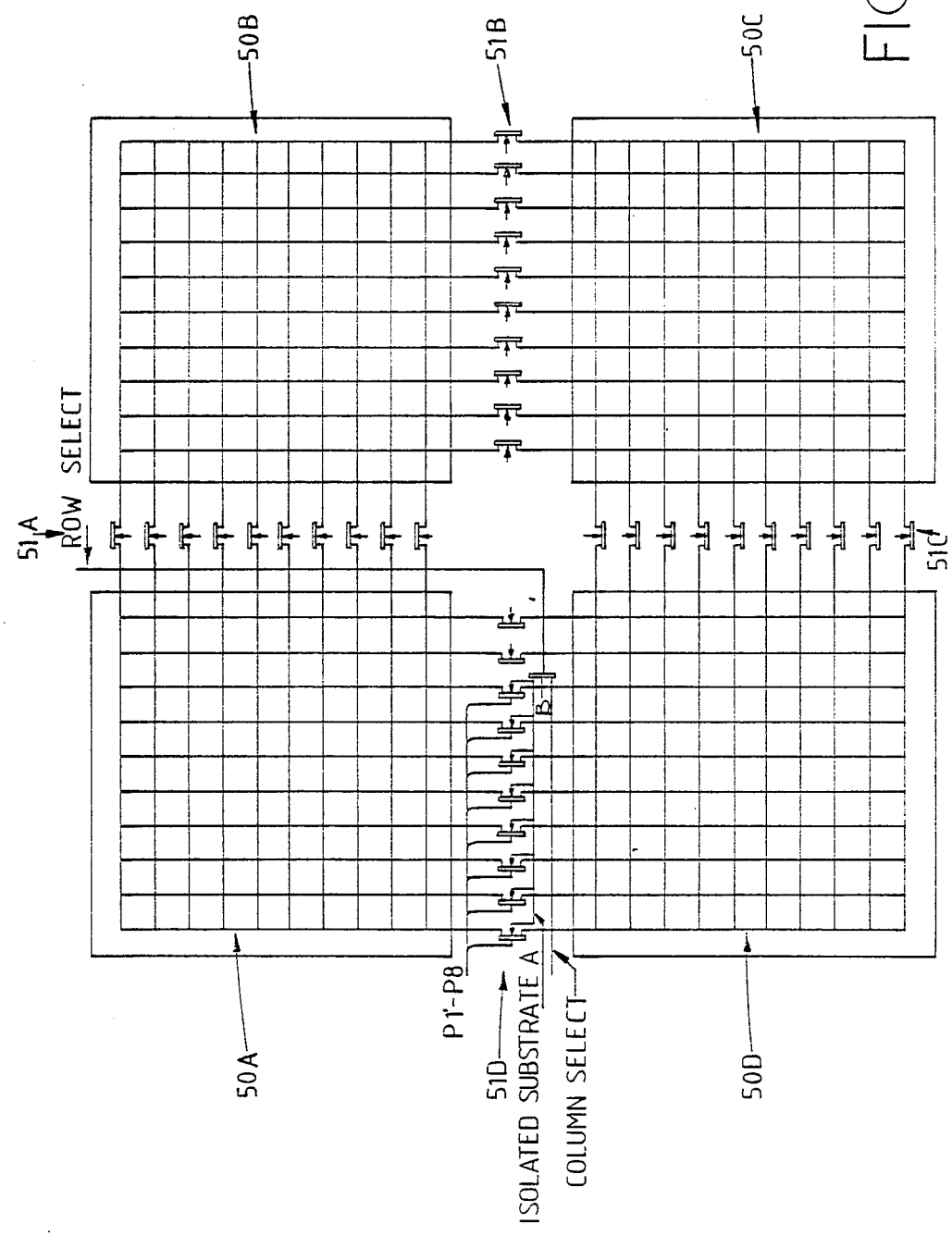
FIG. 6 shows a variant direct connect bus system segmented for subsets of the gate array.
Figure 6A:
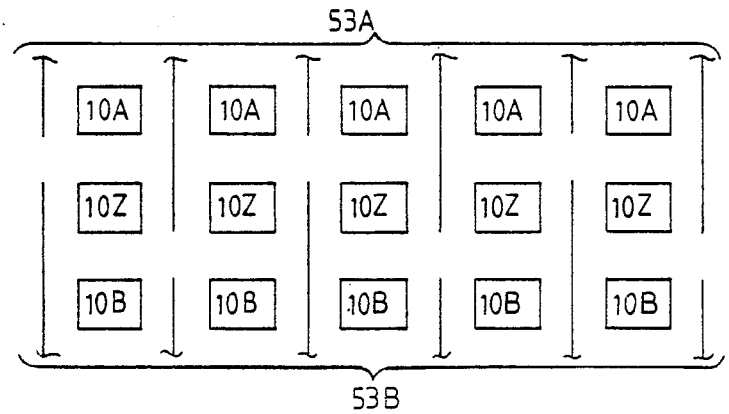
FIG. 6A shows a modification.

FIG. 6 shows a direct connect bus system that is effectively as FIG. 5 but segmented into quadrant subsets 50A-D. Constituent conducting paths are shown (at 51A-D) individually interconnected one-to-one by selectable circuit elements that may be fusible conducting links or selectively enabled/disabled conduction devices such as transistors, see MOS transistors as indicated. It will be appreciated that constituent conducting paths of one or more subsets can be extended into other subsets or not as required, also that there may be more or less subsets than the four shown. Moreover, a particularly convenient segmenting arrangement is available through a modification shown in FIG. 6A, wherein the connection means 51A-D are not shown and at least some paths (53A, 53B) of each subset are extended by at least on gate (10Z) beyond their specific subset (10A, 10B) to give interleaved overlapping. Then, the necessary interconnections to extend each such path can be achieved through logic gates.

Figure 3:
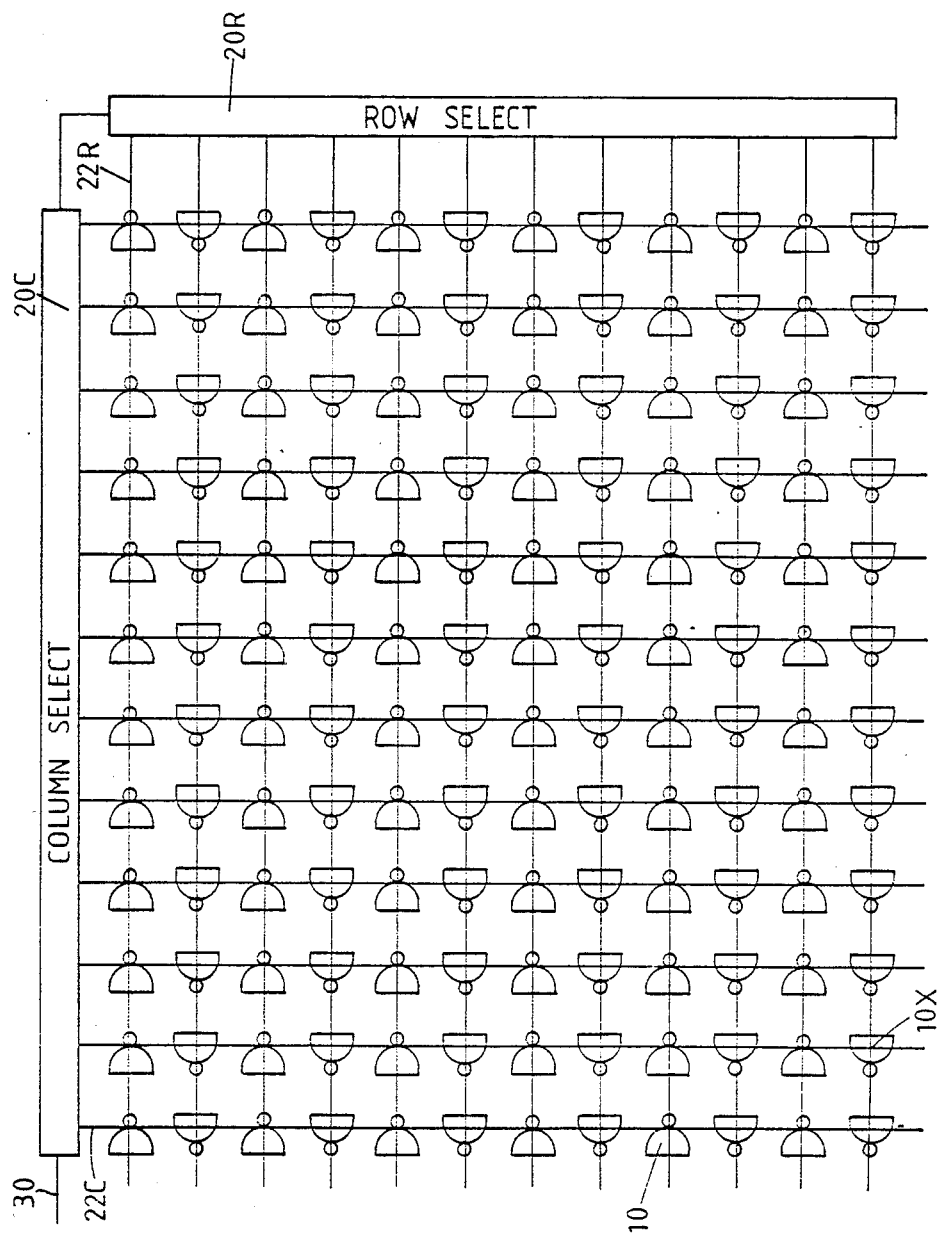
FIG. 3 diagrammatically adds to FIG. 1 a addressing conduction path layout.

Shift registers 20R, 20C are shown in FIG. 3 for sets of row and column following conducting address paths 22R, 22C each serving all the gate sites of its corresponding row or column. At crossing points, each row conductor 22R and each column conductor 22C have branches entering the same gate site (see FIG. 7 and 10X in FIG. 3), so that they can be used in addressing on a coincident signal basis. Such addressing provides, at each addressed gate site an electrical circuit condition required for configuring desired ones of all selectable connections at that site, say by way of enabling application of configuring electrical signals.

The purpose of the shift registers 20R, 20C is, of course, to provide efficient sequential energisation of the gate array, say using a single input pin 30 via which all of the desired addressing contents for both registers is clocked, a single different binary value from each then being sufficient to select any particular gate 10. One shift register could be further usable/extended to store "program" signals for deciding which selectable paths are required at any selected gate site, or a data latch may be used.

Figure 4:
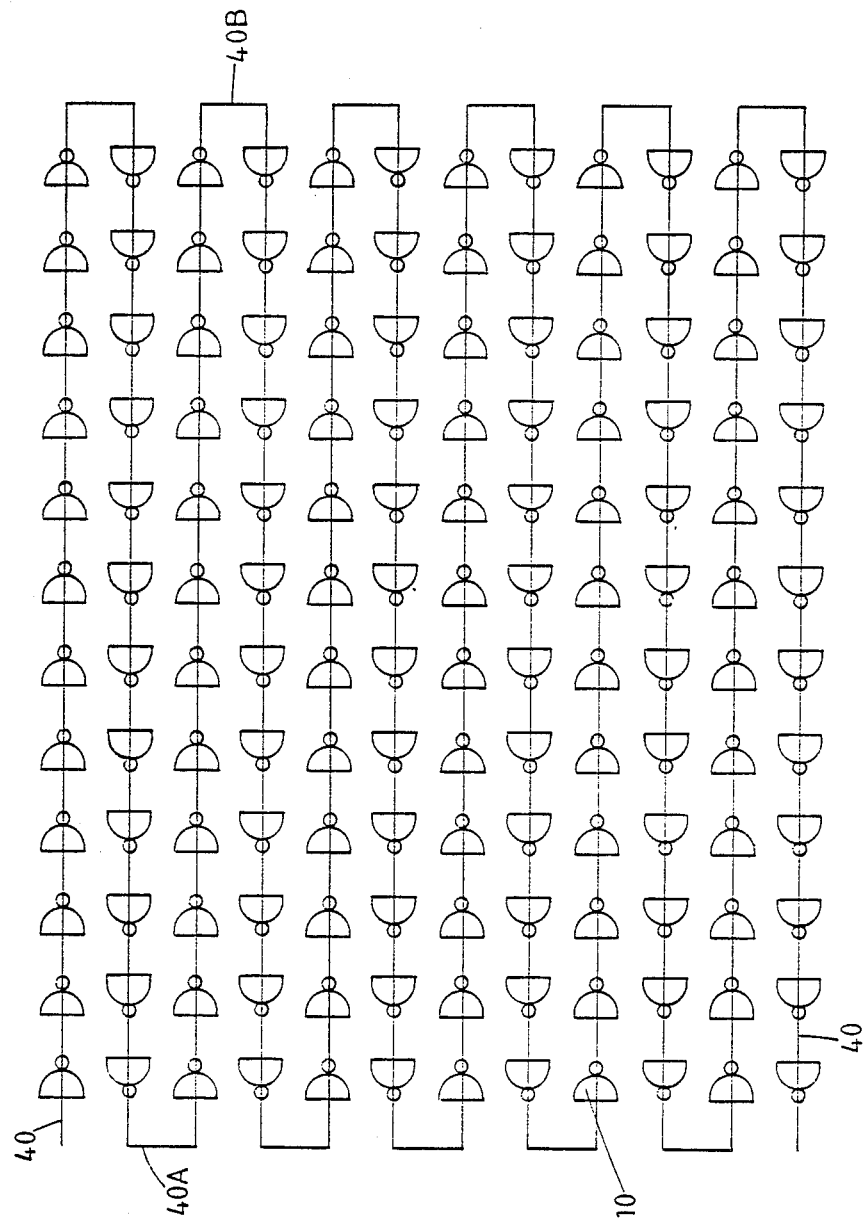
FIG. 4 diagrammatically adds to FIG. 1 a program bus system layout.

In FIG. 4, a program bus system 40 is indicated traversing all gates of the array in zig-zag or snake-like manner, see end links 40A, 40B. The program bus is branched into every gate site (see 43 in FIG. 7). In one arrangement, there is one line (see 42 in FIG. 8) of the program bus dedicated to each different selectable connection of any gate site.

Figure 7:
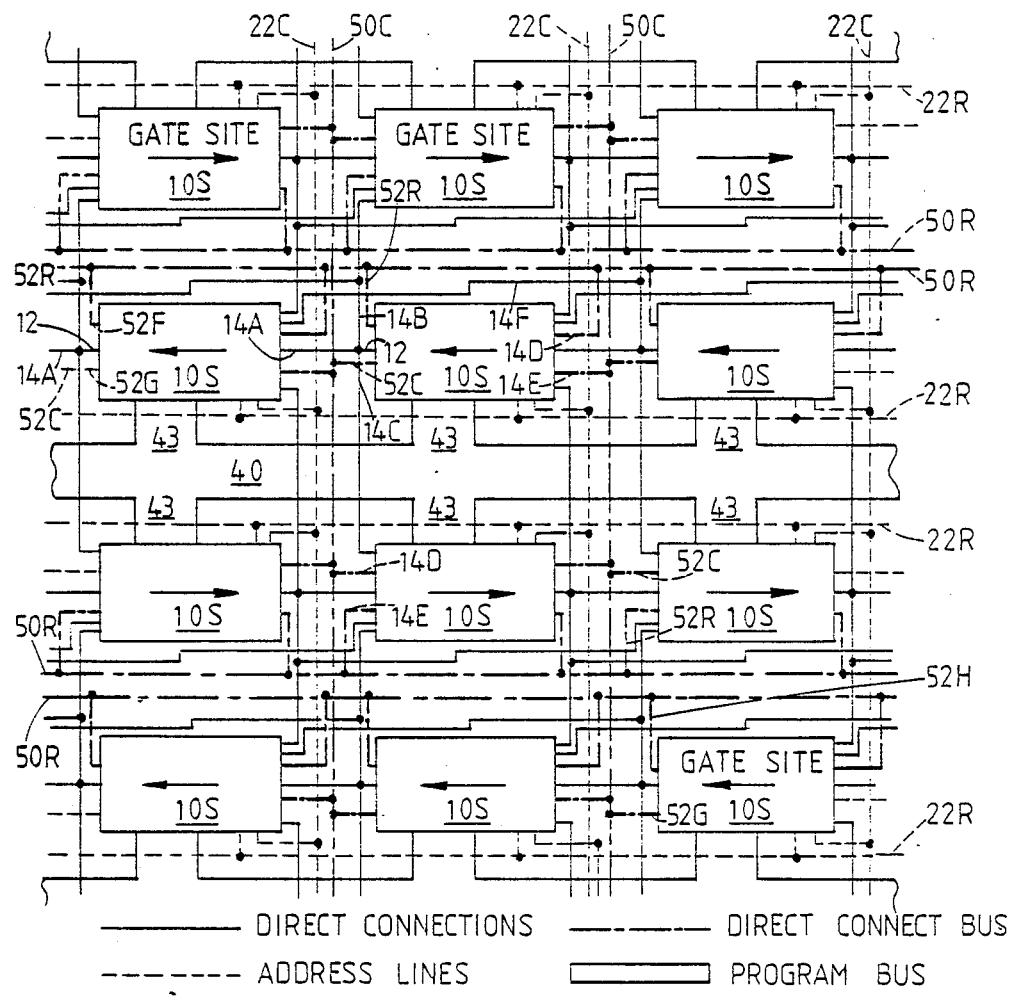
FIG. 7 is a diagram showing all of the FIGS. 3, 4 and 5 provisons on twelve logic circuits of the FIG. 2 layout.

FIG. 7 shows in-principle incorporation of the FIGS. 2 to 5 provisions relative to logic circuit sites 10S that could include NAND gate, or other logic function gates, indeed any useful logic circuitry or combination thereof. The sites 10S each include all selectable circuitry provisions for the selectable direct connection paths 14 and for the branches from direct connect bus paths 50R, 50C.

Figure 8:
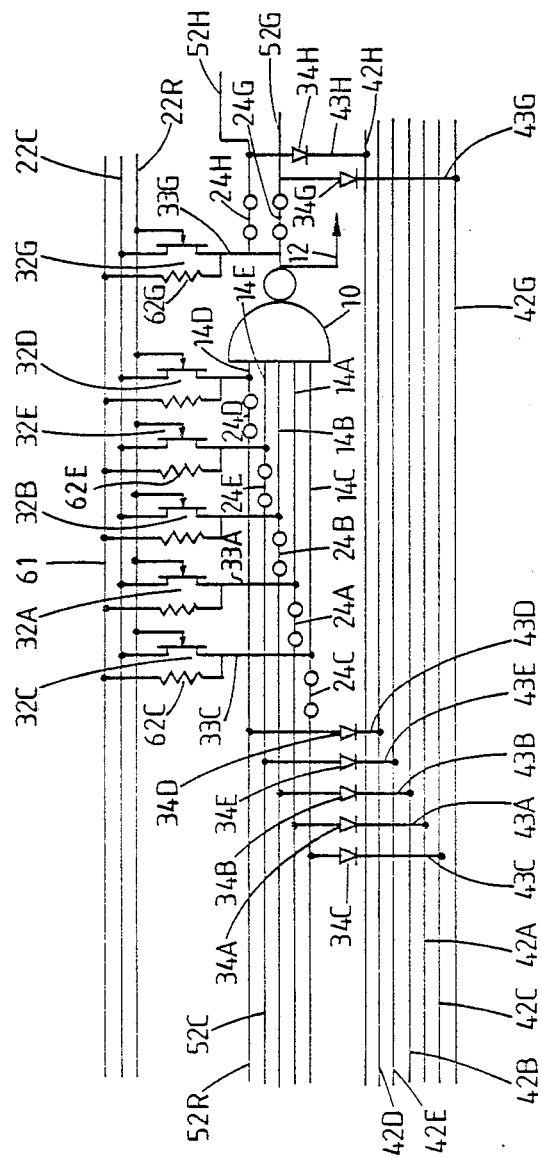
FIG. 8 is a circuit diagram of a NAND gate site using fusible links for its configuration.

One actual provision for selection of selectable connection paths at each gate 10 is indicated in FIG. 8 by means of fusible conducting links 24, i.e. a static irreversibly configurable arrangement. FIG. 8 shows a complete gate site together with traversing address paths (22R, C), program paths (42), and power supply path 61. There, application of a configuring electrical signal as fusing current requires one of field effect transistors 32 (shown as n-channel MOS) formed on the chip to be rendered conductive. Each transistor 32 has its gate electrode connected to the row select line 22R and an input electrode connected to the column select line 22C so as to conduct only when both such lines are energised. When that occurs it changes the voltage condition of line 33 from the transistor 32.

In order to complete circuit conditions for fusing current to flow, program bus lines 42 (of 40) are shown branched, see lines 43 extending therefrom and including steering diodes 34. The lines 33 and 43 are connected to each side of the links 24 in input lines 14 to the gate 10. At a gate site selected by address lines 22R, 22C, all transistors 32 are enabled, but configuring circuit conditions further depend on energisation of the program lines. Fusing current will flow only through fusible links 24 for which program branches to lines 43 are appropriately energised.

One other feature shown in FIG. 8 is feed resistors 62 from power supply line 61 paralleling respective ones of the transistors 32 and serving for NAND gates 10 to hold disabled gate inputs at an appropriate logic level. Obviously, a different voltage level and corresponding holding provision would apply for a NOR gate array.

It will be noted that gate inputs 14, fusible connecting links 24, transistors 32, lines 33, diodes 34, program lines 42 and branches 43, are subscripted A, B, C, D, E, G, H to indicate their operation relative to direction connection paths (A, B, C) and direct connect bus branches (D, E to inputs, and G, H at output branches), respectively. Output branches to 52G, 52H are shown controlled from a single transistor 32G, but separate ones could be provided if desired.

It will be appreciated that FIG. 8 shows gate site input selection, i.e. effectively relative to the second set (SS) of FIG. 1. If preferred or desired, conducting link selection for the paths to inputs 14A, B, C could be provided at outputs from other sites of the other gate sites to which they afford selectable connection. Then outputs 12 would have branches serviced by fusible links, then effectively relative to the first set (FS) of FIG. 1 at each gate site.

The fusible conducting links 24 might be replaced by other selectable conducting links, such as diodes, to be disabled irreversibly (blown). If diodes are used instead of the fusible links 24, a parallel pair of oppositely poled diodes can be provided, one of which is blown. In other arrangements as described with reference to FIGS. 9–11, the selectability of the connection paths can be achieved by active circuit components, typically transistors which are included in the paths and the state of which, conducting or non-conducting, conditions the selectable connection path.

There are alternatives to providing a full program bus 40. Thus, a coding for multiple energisation (say two at a time) of a number of paths or lines less than the number of links involved can be used to identify individual links one at a time at an addressed gate site. That can be done without further requirement for logic at gate sites, by having more than one of each of the row and column lines 22R, 22C but having a unique pair of them connected to opposite sides of any one of the transistor 33—line 24—diode 34 combinations.

Figure 17A:
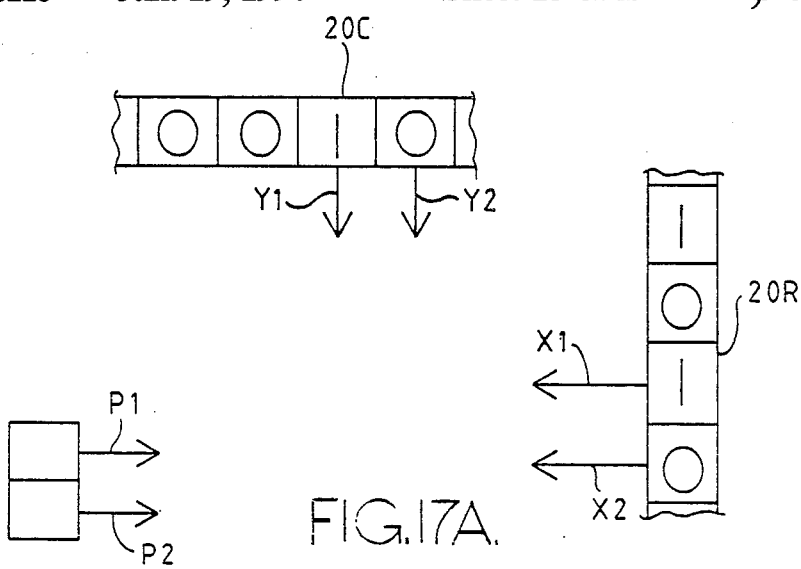
FIGS. 17A and 17B show variant selection logic.
Figure 17B:
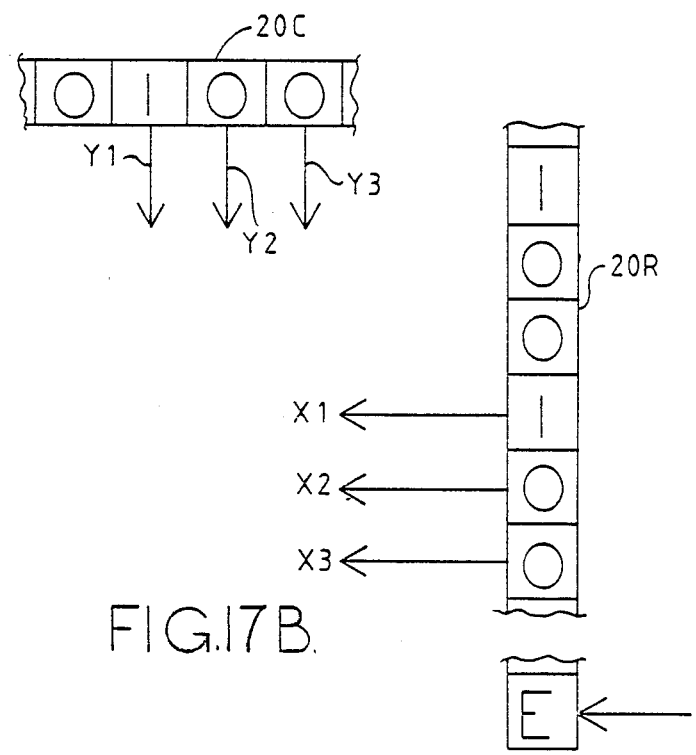

Examples are given in FIGS. 17A and 17B. In FIG. 17A, for each row and column of gate sites, there are two row address paths X1, X2 and two column address paths Y1, Y2. There are also two program bus paths P1, P2 that go to all gate sites. Up to eight selectable connection paths can be serviced at each gate site. Each pair of row and column address paths (Y1, X1; Y1, X2; Y2, X1; Y2, X2) will identify two selectable connection paths at the gate sites where they coincide, and the program paths P1 and P2 will serve in selectively applying configuring electrical signals. In FIG. 17B, there are three row address paths X1, X2, X3 and three column address paths Y1, Y2, Y3 going along each row and column of gate sites. They enable identification of up to nine selectable connection paths at a gate site, again on a coincident current basis (Y1, X1; Y1, X2; Y1, X3; Y2, X1; Y2, X2; Y2, X3; Y3, X1; Y3, X2; Y3, X3). Where configuring electrical signals are required, a single path for that purpose will replace the above-discussed plural program paths. If the selectable connection paths can respond directly and only to applied address signals (as will be described for FIG. 18), only a selectively applied enable signal (ES) is required for one of the sources of row and column address signals. In FIGS. 17A, 17B, such sources are again shown as shift registers 20B, 20C and will obviously be longer than required for single row/column address paths. As shown, the column address register 20C has a binary '1' value that is propagated to energise all of the column paths in turn. The row address register (20R) has successive patterns (10, 100) for cyclically energising each row address path once for each energisation of a corresponding column address path, i.e. will be clocked faster (twice or three times) than the column and address register.

Figure 9:
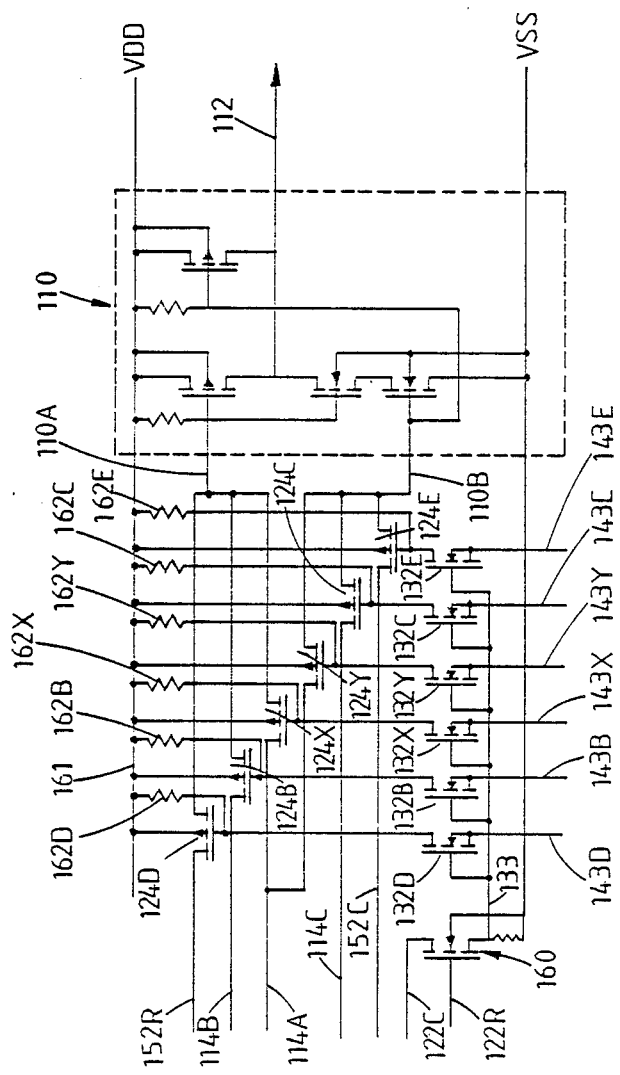
FIG. 9 is a circuit diagram of a two-input NAND gate site using reconfigurable connections of static MOS type.

FIG. 9 shows selectably controlled input circuitry for a logic gate site using reversible circuit elements 124. The gate 110 itself has two operative inputs 110A, 110B and one output 112. The operative inputs 110A, 110B can receive selectable direct connection paths 114A, 114B, 114C from neighbouring gate sites. Selectable connection path 114A can go to either or both of operative gate inputs 110A and 110B, by way of selectively conducting/non-conducting circuit elements 124X and 124Y for signal pass purposes. Connection paths 114B and 114C can be selectably connected only to 110A and 110B, respectively, through selectably conducting/non-conducting circuit elements 124B, 124C. In addition, selectably conducting/non-conducting circuit elements 124D and 124E are shown controlling access to 110A and 110B, respectively, from the connect bus row and column lines 152R and 152C. FIG. 9 thus shows one way for a two-input gate to receive signals from neighbouring gates (on 114A, B, C) and/or from direct connect bus lines (on branches 152R, C) it being understood that not more than one of the circuit elements 124X, B, D and one of the circuit elements 124Y, C, D will be selected at any one time.

Provision for conduction/non-conduction selection, in the case of FIG. 9, involves setting of the conduction state of active circuit components (124) in the form of (MOS) field efect transistors as the selectable signal pass circuit elements 124. That is shown as relying, for site addressing, upon conjunction of row and column addressing signals on address path branches 122R and 122C to transistor 160 whose gate is connected to the substrate (VSS). The transistor 160 is then operative to energise line 133 and thereby enable a set of floating gate transistors 132X, Y, B-E for operation according to energisation states of branches 143X, Y, B-E from the program bus, respectively. Effectively, the floating gate transistors (132), when enabled over the line 133, can be selectively caused to store a binary "0" or binary "1" according to applied signal levels on the program bus producing corresponding charge states. In turn, they determine and maintain saturation (ON) and non-saturation (OFF) of the selectable MOS transistors 124.

Pull-up resistors 162 connected from line 161 across the transistors 124 serve to maintain unselected ones of the transistors 124 in their non-saturated (OFF) state.

FIG. 9 does not show output branching on a selectable basis back to the direct connect bus lines, but that can readily be provided. As for FIG. 8, the gate sites of FIG. 9 could be reorganised with selection provisions for local direct connection paths made in branches from gate circuit outputs. The same is true also for FIGS. 10, 11 and 18 to be described. A further option would be to have a selectable connection path between lines 152R and 152C before the transistors 124 and provision for selecting that connection, i.e. a further combination of another signal-pass transistor 124, a charge-trapping transistor 132, and a program line 143.

It is noteworthy that two-input gates are the norm for present-day integrated circuit technology at least in relation to ULAs.

Figure 10:
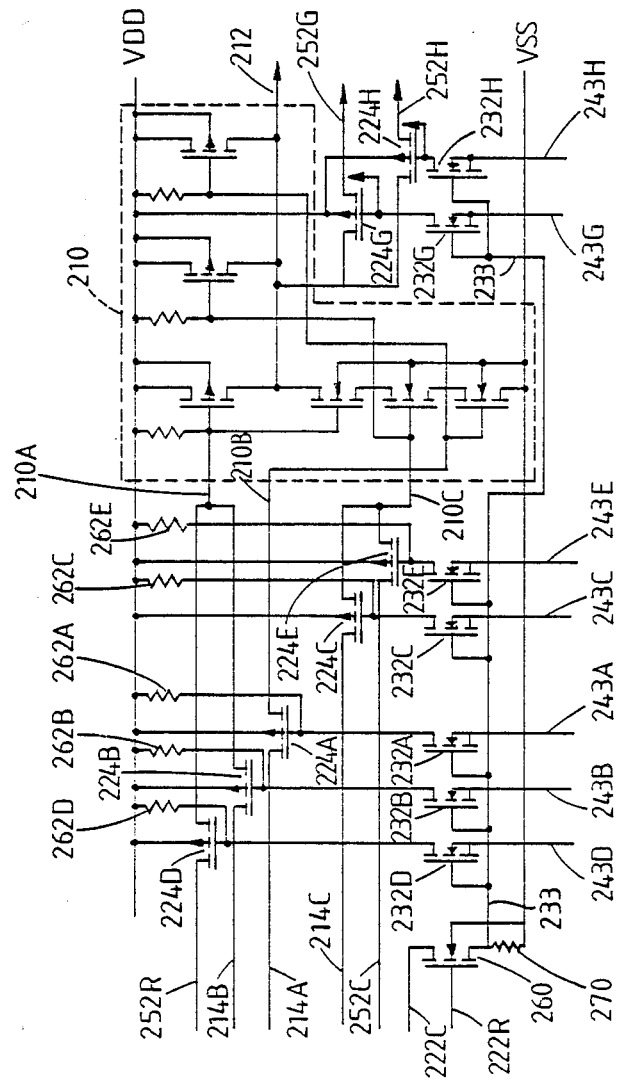
FIG. 10 is a circuit diagram for a three-input NAND gate side on a similar basis to FIG. 9.

FIG. 10 shows a three-input NAND gate 210 of MOS type having operative inputs 210A, 210B, 210C, and output 212. Of those inputs, 210B has a selectable connection for path 214A, and 210A and 210C are shown with alternative selectable connections to paths 252R, 214B and 214C, 252C, respectively, i.e. to direct connect bus and column-adjacent gate inputs. In each case, that is through selectably conducting/nonconducting MOS transistors 224A-E. In like manner as for FIG. 9, the transistors 224A-E are shown associated with floating gate transistors 232A-E, program branch lines 243A-E and address line 233 from address transistor 260. Additionally, however, FIG. 10 shows further selectable signal-pass transistors 224G,H in branches from the gate output 212 to the direct connect bus lines 252R, 252C, and corresponding floating gate transistors 232G,H connected to the program bus branches 243G,H. Again, pull-up resistors 262 are shown across the signal-pair transistors 224A-E, and will be similarly provided for transistors 224G, H, see arrowed branches from their control electrodes (gates).

Gate sites of the FIG. 9 type can be provided with selectable output branches in the same way as for FIG. 10.

The circuits of FIGS. 9 and 10 provide for selectably establishing conduction/non-conduction states of their signal-pass transistors 124, 224, and for charge-trapping transistors 132, 232 to serve as programmable/erasable storage means that maintains desired conduction conditions for transistors 124, 224 on a static basis.

Further concerning FIGS. 9 (or 10), it will be appreciated that the selectable connection options could require current carrying capacity of the transistor 160 (or 260) equivalent to that of several of the transistors 132 (or 232), typically up to four thereof. In terms of circuit realisation on semiconductor material, usually silicon at present, it may be advantageous, or at least considered to be so, to avoid having to form significantly different sizes of transistor. A particularly compact implementation on silicon is to have each of the transistors 132 (or 232) directly enabled in common from the column select line 122C (or 222C) and each associated with an individual transistor, which latter transistors are further to be enabled in common from the row select line 122R (or 222R).

It is feasible to treat the program lines 143, 243 as a data bus and to treat switching transistors replacing the charge-trapping transistors 132, 232 or even the selectable transistors 124, 224 themselves (see later FIG. 11), effectively as memory devices of dynamic RAM type, i.e. requiring refreshment. Then, the actual configuration of an overall circuit using gate sites of the thus modified FIGS. 9/10 type could be stored in external memory, whether of permanent (ROM), semi-permanent or dynamic refreshed RAM, or reconfigurable EPROM type, or even of other type. All that is required is a sequential addressing/gating facility to operate in cycles refreshing each gate site hereof within its required refresh time. Then, such chip circuitry, compared with FIGS. 9 and 10, can actually be simplified, not only by replacement of charge-trapping transistors of floating gate or oxide nitride sandwich types by normal MOS transistors, but also by omission of the pull-up resistors 162, 262. Such chips would, of course, be reconfigurable at any time in the manner discussed hereinbefore and, at least when used in a computer system, it is feasible for such chips to have alternative configurations for the same function, and for a test pattern or routine to be applied periodically to check for any part of the chip going faulty, to identify same, and to go to an appropriate alternative configuration. A development of such a chip is described for FIG. 11.

Figure 11:
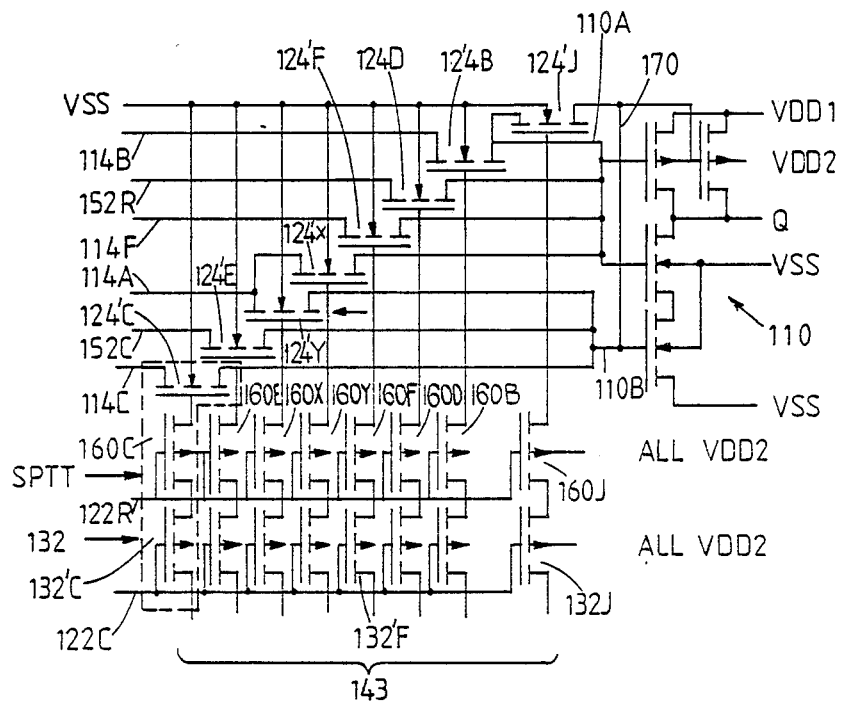
FIG. 11 is a circuit diagram relating to a NAND gate site using reconfigurable connections of a dynamic MOS type.

FIG. 11 shows a gate site circuit for which the basic logic gate 110 is a two-input NAND having inputs 110A and 110B as for FIG. 9. Subscripted references 160B, C, D, E, F, X, Y are used for column address path enabled transistors shown interposed in series between the transistors 132' and 124' (opposite channel type to FIG. 9), with the program branches 143 applied to the drains of the former.

Further compared with FIG. 9, FIG. 11 shows an additional selectable input connection path 114F with associated connection setting and selection transistors 124'F, 132'F and 160F, which comes from the next but one gate site output before it in its row, as for further input 14F of FIG. 2. Also, a further selectably conductive transistor 124'J is shown and, at 170, an associated connection of the logic gate input 110B to output of the transistor 124'J and to the gate output stage. Connection 170 serves for control purposes in stabilising the gate response to inputs 110A, 110B when only one of them has a signal, and thus obviates the need for the two pull-up resistors shown unreferenced in FIG. 9. In addition, the path 170 and associated transistor 124'J permit a selected one of the paths 114A, 114B, 114F and 152R and a selected one of the paths 114A, 114C and 152C to be interconnected. That enables signals to be routed through such interconnection directly without traversing the logic gate. Also there are no pull-up resistors (162) for the selectable connection state setting transistors 124', which reflects operation of the FIG. 11 circuitry in a dynamic mode rather than a static mode, i.e. on a refreshed basis, say from an associated ROM or RAM.

Reconfigurability of the FIG. 11 embodiment is due to incorporating embodiments of the single signal-pass field effect transistor transmission gate of our above-mentioned separate patent application, one of which is to be seen within the dashed block labelled SPTT. There, the MOS transistor 124'C is the pass transistor in relation to line 114C and the switching transistors for refresh purposes are 160C and 132C. Operation is by reason of inherent gate capacitance to give state-storage and signal-pass in the same transistor, and it could be useful to enhance capacitance of the signal-pass transistor relative to other transistors, such as used (132, 160) for switching purposes in selecting a signal-pass transistor for conduction. A p-channel transistor can be operated at +5 volts to −5 volts to avoid degradation at logic 'low' (0 volts) due to threshold effects (VT). Then, VDD1 and VDD2 would be at +5 volts and VSS would be at 0 volts for the logic gate but at −5 volts for the signal-pass transistors. For n-channel transistors, as shown, operation at acceptable speed results using voltage levels of +3 volts (effectively logic 'high' for the gate) and +5 volts at VDD1 and VDD2, respectively, and VSS at 0 volts.

Figure 12:
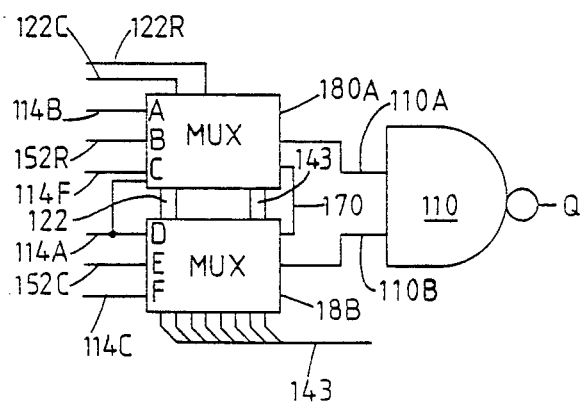
FIG. 12 is a block circuit representation of the FIG. 13 embodiment.

The circuitry of FIG. 11 can be represented, see FIG. 12, by a two-input NAND gate 110 and two multiplexers 180A and 180B for inputs 114B, 114F, 152R and 114A, 114C, 152C, respectively. Input 114A is shown, as in FIG. 9 and 11, to be available also to the multiplexer 180A. Also, and in connection with the fourth gate site interconnection 114F from the next but one preceding gate site, it may be found to be advantageous (in avoiding unecessary cross-overs) for the inputs 114A and 114F to be alternately interchanged along each row of gate sites, see FIG. 13 and FIG. 2. FIG. 12 also indicates at 170 the capability for inputs to go from one multiplexer to the other without traversing the logic gate 110. For convenience, only one set of inputs are shown going to the multiplexers 180A, 180B for selection purposes. As indicated in FIG. 13 by blocks 200 (GMUX is short for multiplexed gate) each gate site can be considered as including the logic gate proper (110) and the multiplexer parts (180A, 180B).

Figure 13:
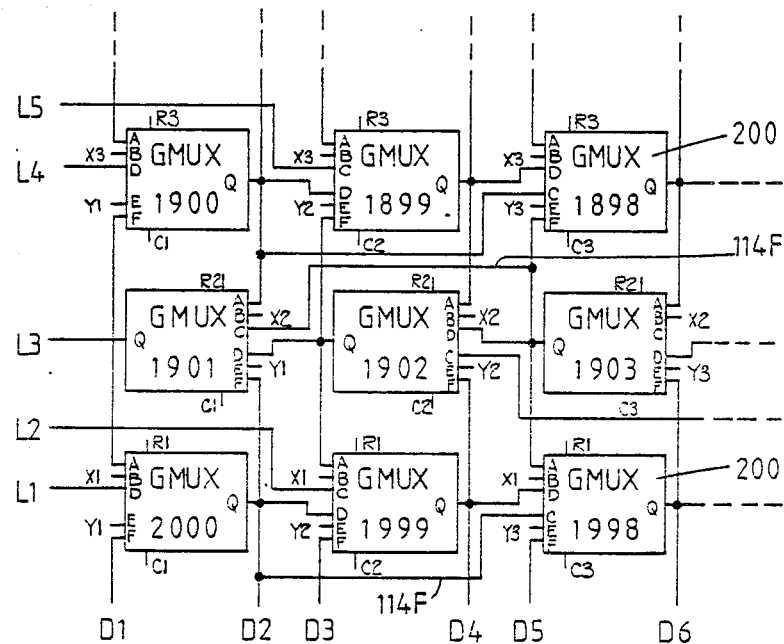
FIG. 13 is a block circuit diagram of FIG. 12 gate sites at a corner of a reconfigurable array.

The FIG. 13 diagram is at a corner of a configurable gate array and is further useful in relation to the following description concerning input/output provisions.

Figure 14:
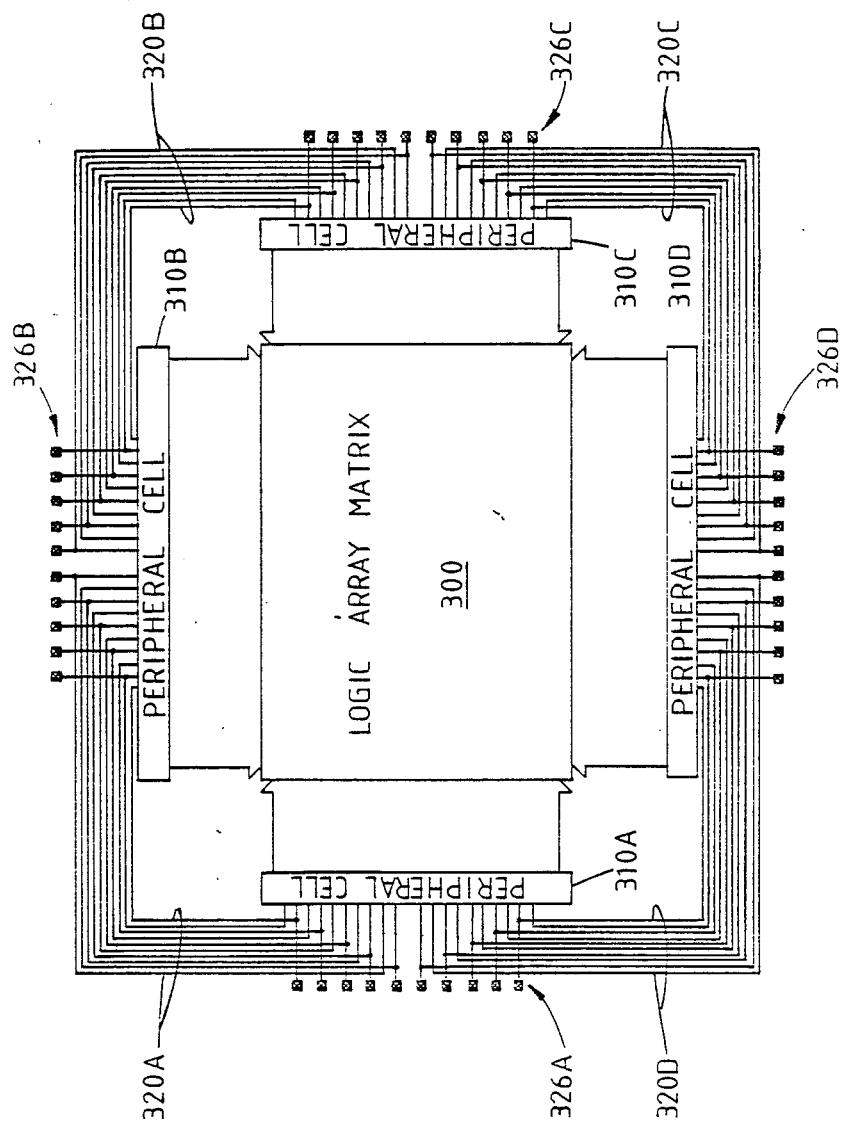
FIG. 14 is a schematic diagram of a reconfigurable gate array (300) and peripheral input/output cells (310A, B, C, D)

Turning to input/output provisions, FIG. 14 shows a central rectangular area occupied by reconfigurable logic gate array 300, and peripheral cells 310A, B, C, D outside that area, actually at each edge. Logic circuit sites of the gate array may be as for FIG. 11, and corners of the array as for FIG. 13. Outside the peripheral cells 310, are conduction buses 320A, B, C, D going about corners of the chip and branched from conduction paths going between edge input/output pins or pads 326A-D and the peripheral cells 310A-D. The peripheral cells 310 A-D serve in communication between those pads 326 and array input and output lines at each edge, though it will be noted that buses 320A-D do allow flexibility in permitting pads 326A-D at any one side of the chip to be inputs/outputs alternatively for the peripheral cell at the next adjacent side of the chip.

There are more logic array input/output lines than there are pads 326, typically a ratio of more than ten to one. One envisaged chip of 50×40 logic gates has 520 array input lines and 40 pads. The aim, however, is simply to suitably relate necessary array lines with a convenient, preferably conventional, number of pads (or pins) for integrated circuits. Patterns of connections of the pads to groups, respectively, of the array lines are preferably formed at edges of the array 300.

In FIG. 14, peripheral cell 310A services row inputs/outputs from one side of the gate array 300 (left as shown) and peripheral cell 310D services column inputs/outputs from another side of the gate array 300 (bottom as shown). Peripheral cells 310C and 310B similarly service the other array sides, respectively. Regarding the pads 326, the peripheral cell 310A services all of those at the adjacent chip side directly, and half of those at each adjacent chip/array side are directly serviced by other peripheral cells 310D and 310B. The other peripheral cells are similarly organised.

In FIG. 13 it will be noted that alternate ones (odd-numbered) of the column array lines (D) each serve only inputs to gates of the edgemost row of the array 300 (FIG. 14), and that other ones (even-numbered) serve outputs of the same gates but can further serve inputs of the next row of the array. For row array lines (L), the pattern reflects the fact that the gates of adjacent rows alternate in direction. Every third row (L1, L4) array line serves only an input of the end gate of alternate rows, the next lines (L2, L5) serve only an input of the second to end gate of the same rows, and the next lines (L3) can serve both output from the end gate of the other rows and alternative input to the end gates of flanking rows. The capability to get directly to both edge-most gates of the array and those gates next to them is advantageous. However, it will be appreciated that there is much deeper possible access, whether by the aforementioned direct connect bus system or by going into and out of multiplexer parts of gate sites or by traverse of gates thereof.

Figure 15:
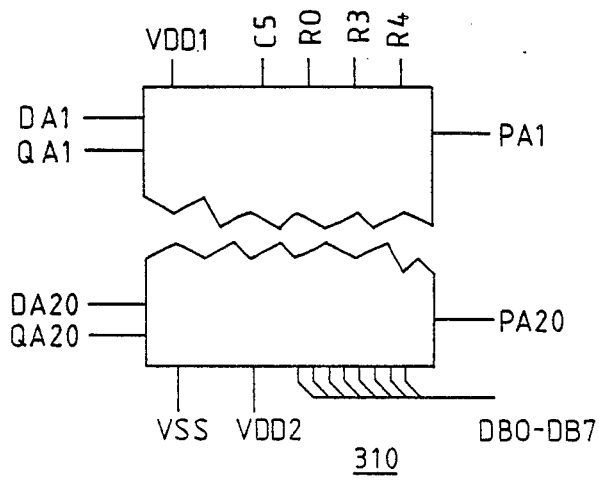
FIG. 15 is a block circuit representation of a peripheral cell.

A diagrammatic representation of a peripheral cell 310 is shown in FIG. 15, see array lines DA, QA representing inputs/outputs of logic gates and pad lines PA. Each peripheral cell is a set of subcells one for each pad PA, each subcell being as shown (330) in FIG. 16 from which the purpose of other lines of FIG. 15 will be appreciated.

Figure 16:
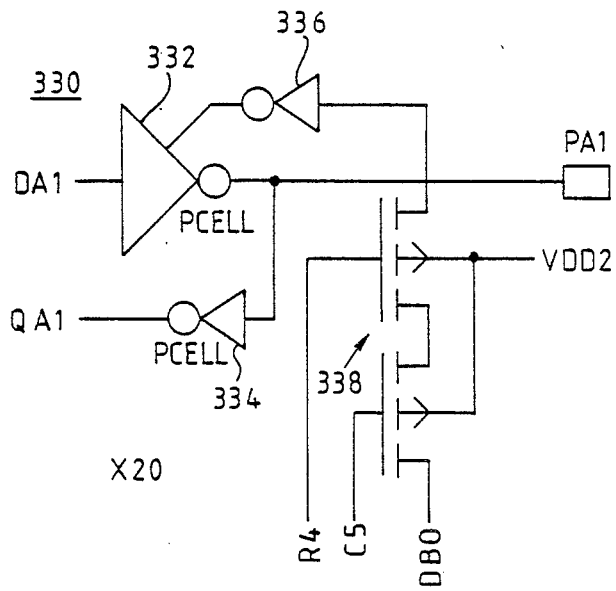
FIG. 16 is a schematic circuit diagram of a typical subcell of the peripheral cell.

In FIG. 16, subcell 330 actually provides for its pad line (PA) to serve as either input or output in a particularly efficient and advantageous way. The subcell 330 has a tristate inverter 332 and two inverting transistors (334, 336). 332 and 334 are connected to gate lines QA, DA of the logic gate array 300 for input and output purposes relative thereto and to the corresponding pad PA. 336 determines the input/output service status of the subcell, being connected between circuitry 338 and control for the inverter 332. The circuitry 338 has two series connected MOS transistors (unreferenced) having their gates connected for coincident signal enablement (address lines R4, C5) and their substrates connected to logic voltage high, so as to pass a bit signal for determining the service state of the subcell (shown from line DBO of input/output configuring data bus or the aforesaid program bus). The subcell service state (input or output) is set and maintained on a dynamic basis relying on input capacitance of the inverter 332 in much the same way as self-capacitance is used in the single-pass transistors 124 of FIG. 11.

In operation, the subcell 330 has its tristate inverter 332 controlling transmission from the chip through the pad PA (output) or for blocking such transmission when the inverter 332 "floats" and there is transmission into the chip from the pad via the inverter 334 (input). Additionally, and most advantageously, there is the capability of transmission between the array lines (DA, QA) which can be used by the logic gate array if required.

It is possible to replace the inverter 332 by a NAND gate so as at least to be able to get control or data signals from the logic array for outputting via the pad (PA), say to an external computer or other system on a tristate basis where array configuration conditions can determine input or output or neither.

It is, of course, possible to control the input/output status of any subcell of each peripheral cell by program and/or from ROM, which is particularly advantageous in conjunction with reconfiguration potential of chips hereof, i.e. any pad can be input or output and has a considerable choice of immediately accessible logic array gates, though obviously not limited thereto.

It will have been noted that there is direct correlation of one pair of array input and output lines (DA, QA) to one pad (PA), ignoring pad interconnections 320 of FIG. 14. Another feature hereof is thus that the array lines (QA, DA) are not actual array lines (L, D) but represent output connections (DA) to sets thereof selected on a basis intended to maximise efficiency in view of some inevitable loss of choice, though all inputs (QA) will go to all available inputs of the edge of the arrays. That, connection scheme is, of course, a matter for judgement by chip designers but should, we believe, take into account that less input/output flexibility is required near corners of a gate array then medially thereof. In fact, some lines it serves will have no connections to the peripheral cell, perhaps (for columns, but not necessarily rows) on a basis missing alternate ones closest to the corner, but only every fourth otherwise, and grouping intervening three actual array lines appropriately to speed access in an alternative way relative to the two halves of side pads PA and then their interconnections 320.

Figure 18:
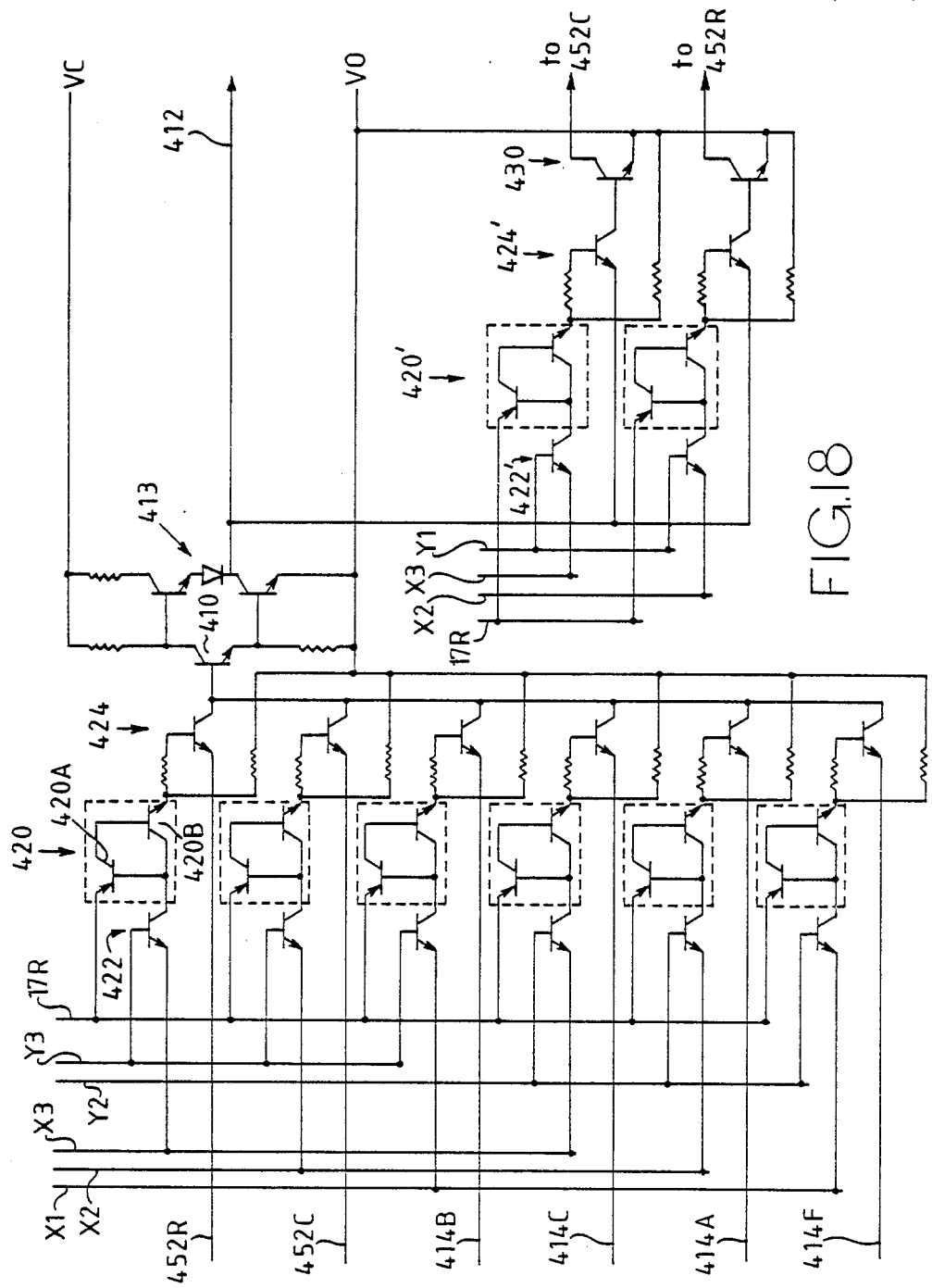
FIG. 18 is a circuit diagram of a NAND gate site using bipolar technology and reconfigurable without requiring refreshment.

FIGS. 9 to 11 hereof have all been conceived for field effect chips, specifically CMOS. FIG. 18 shows gate site circuitry for a bipolar chip.

In FIG. 18, a bipolar NAND gate comprises a transistor 410 in combination with transistors 424 also serving as selectable inputs thereto. Gate output 412 is shown buffered (413) in generally conventional manner. Control of the conduction states of the transistors 424 is shown at 420 by way of equivalents to SCR-type devices in turn controlled by respective transistors 422. Similar circuitry, shown with primed references, is used for branches from the output 412 of the gate but relative to individual transistors 430 to give required separate outputs to the direct connect bus (452).

Complementary transistors 420A, 420B are shown each having its base connected to the collector of the other, so as to be triggerable (under suitable applied voltage conditions) by a pulse signal at one of its base-collector connections and go to a prescribed voltage level. That level will then persist after triggering until applied voltage conditions are changed.

The transistor 422 serves to apply such triggering on an addressed basis, in this case by being made momentarily conducting by signals from a unique pair of one of row following lines X1–X3 and one of column following lines Y1–Y3 of coded address buses of the logic gate array, i.e. in the manner envisaged with reference to FIG. 17B.

It is noted that the transistors 422 and triggerable arrangements 420 operate without requiring separate address (enabling) signals and configuring signals. Moreover, whilst the transistors 424 clearly operate on a selectable signal-pass basis, they actually form parts of the NAND gate itself.

It is also noteworthy that the NAND gate of FIG. 18 will operate as a true six-input gate for all of the direct connect inputs 414A, B, C, F and the direct bus connections 452R, 452C. (That possibility was implicitly envisaged for the FIG. 8 embodiment, though the use of field effect transistors for selecting conduction purposes may make the FIG. 9 or 11 arrangements more practical in relation to two-input gates).

Furthermore, the output branch transistors 430 give an inverted output (relative to gate output 412), and are of open-collector configuration enabling what is in effect a wired-OR type output capable of multiple line driving.

Before considering system aspects arising in utilisation of reconfigurable logic circuit chips hereof, it is deemed useful to point to several features generally characteristic of presently envisaged embodiments of this invention. From what has been described relative to the drawings, it will be apparent that selectability may be achieved by providing a fusible link or diode or similar element in each selectable connection which, by the application of an appropriate signal, can be disabled thus causing a single irreversible change from a conducting to a non-conducting state. In other cases, the selectability may be achieved by incorporating an active circuit component such as a transistor in the connection path in such a manner that its conducting or non-conducting state determines the state of the connection path on a reversable basis, selection signals being applied to the active circuit component to control its state as required. Control of the transistor or similar element may be on a static bais such that changes of state require a special operation, or on a dynamic basis where desired states require to be refreshed during normal system operation but can likewise be changed, or on a static basis for which changes can also be made as part of normal system operation.

Also, even if less sophisticated input/output arrangements are employed on a chip, and even if much more complex logic circuits are implemented, it is not expected that any logic circuit will be directly connected (14) to more than 5% of the total number of logic circuits present, generally less than 1%, even lower than 0.01% for simple logic gate circuits. Typically, the number of connected logic gates will be ten or less often five or less. Also, it is expected that chips hereof will contain at least 500 logic circuit sites, advantageously more than 1000, and that each logic circuit site will occupy less than 0.2% of the area devoted to such sites. Our preference is for less than 25% of each logic circuit site to be occupied by its actual logic circuit, which is demonstrated in FIGS. 8, 9, 10, 11 and 18 by relative numbers of transistors in actual gate circuits and in associated connection path selection circuitry.

Figure 19:
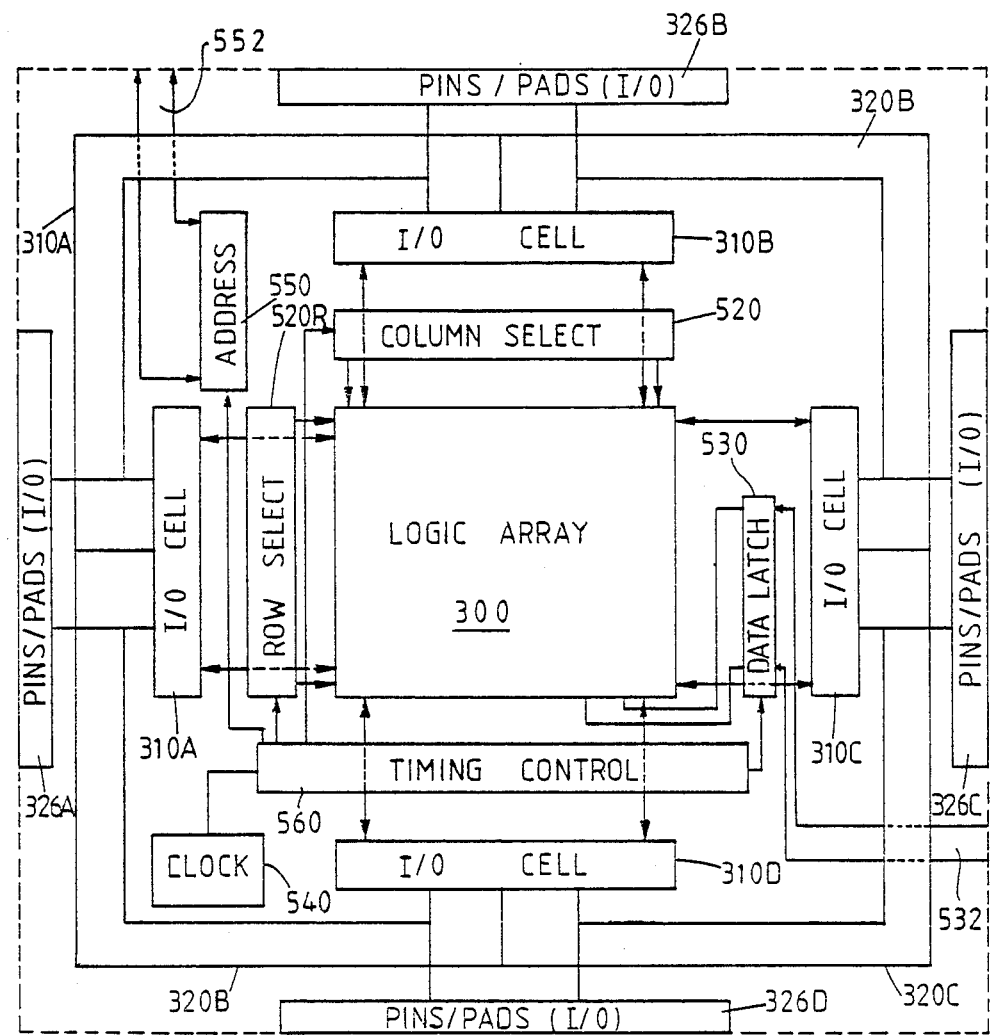
FIG. 19 gives an indication of what will normally be present on a chip hereof.

FIG. 19 shows a typical possible overall chip layout, effectively adding to FIG. 14 the row and column addressing shift registers 520R and 520C, a data latch 530, clock 540, an address register 550, and timing control 560.

The address register 550 and the data latch 530 are shown with associated buses 552 and 532, respectively, to edges of the chip where there will be pins or pads separate from the input/output pins or pads 326. They are used for dynamic chips in effecting refreshing, when the address register will be a counter cycling through part of a ROM or RAM storing the configuration of the chip, and the data latch successively stores binary words from the ROM or RAM that successively define which selectable corrections are required at addressed logic circuit sites. Timing signal lines are shown going to the counter 550, the latch 530, and the row and column select registers 520R,C. These provisions are also used in loading configurations under control of the configurable chip itself. There may be two control signals to the address counter 550, one for counting at chip-controlled loading or refreshing, and the other for read/write control to allow the address counter also to be loaded through the bus 552.

We have previously referred to electronic system aspects of this invention arising from use of configurable chips, particularly chips that are reconfigurable at or near normal logic signal levels and speeds.

Figure 20:
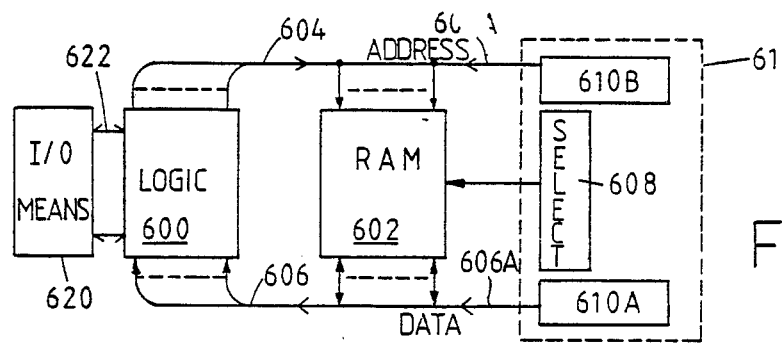
FIGS. 20 to 22 are block circuit diagrams useful in explaining systems applications of chips hereof.

FIG. 20 shows association of a reconfigurable chip 600 with a RAM 602 communicating with the chip 600 by an address bus 604 and by a two-way data bus 606. Selection means is indicated at 608 for causing the RAM 602 to be loaded or reloaded with configuration data for the chip 600. Utilisation means is shown at 620 and will usually supply input signals for processing by the chip 600 as well as take signals representing results of such processing. Such signals will be on bus 622 connecting to input/output pins (326) of the chip.

Reconfiguration may be to different purposes or to the same purpose, and refreshing may be required. Reconfiguration for different purposes can be controlled by a sequencer as part of the selection means 608. That can be in relation to several configurations resident in the RAM 602, or in relation to configurations that require sequential loading into the RAM 602. The selection means is shown as part of host or associated apparatus 610 that will normally further include at least configuration data (610B) and addressing (610A) facilities for the RAM 602 over extensions 606A and 604A of the buses 604. It is the case, of course, that the chip 600 will usually include provision itself for addressing the RAM 602 over the bus 604.

Similar considerations apply to reconfiguration to the same purpose, when it is most likely that the RAM 602 will contain at least some alternative, or back-up, configurations. Test patterns can also be stored in the RAM 602 or supplied from the apparatus 610.

Figure 21:
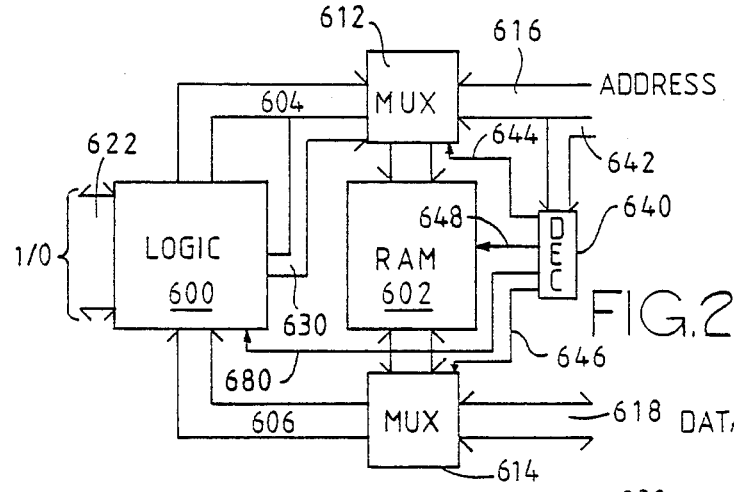

FIG. 21 shows a generally similar arrangement of reconfigurable chip 600 and RAM 602 connected by address and data buses 604, 606. However, multiplexers are shown at 612, 614 to control whether the chip 600 has access to the RAM 602 over buses 604, 606 or whether configuration buses 616, 618 have access to the RAM 602. That can permit rewriting of the RAM 602 without interrupting operation of the chip 600.

Also, specific provision is shown for the chip 600 to address different parts of the RAM 602 (corresponding to different configurations for the chip) over further address lines 630 indicated as coming from part of configurable input/output provisions of the chip 600. That further results effective control of configuration selection by means connected to the input/output system 622, as well as in accordance with a condition otherwise arising in the chip 600. It should further be appreciated that the address bus 604 could have its most significant lines serving the purpose of lines 630, say coming from a suitable latch section of the address register (550 in FIG. 19) that does not respond to counting cycles required for any refreshing of a currently resident chip configuration.

Further, FIG. 21 shows provision for operation as one of a plurality of chips making up an electronic system. An identification decoder is shown at 640 connected to receive selected (usually most significant) lines 642 of the configuring bus 616. If the decoder 640 recognises that its associated chip/RAM combination 600/602 is concerned, it will appropriately enable its output lines 644 and 646 to cause the multiplexers 612, 614 to switch the RAM 602 from buses 604, 606 to configuring buses 616, 618. Also, decoder output line 648 will put the RAM into write mode. Decoder output 650 may disable the chip 600 if there could be a clash with refreshing a dynamic chip 600 or other call from chip 600 for a new configuration. Such clashes should, however, be avoidable by suitable system timing, when the current configuration could be rewritten to the first configuration section of the RAM 602 and the line 650 used to reset the lines 630 or writable address register latch.

Figure 22:
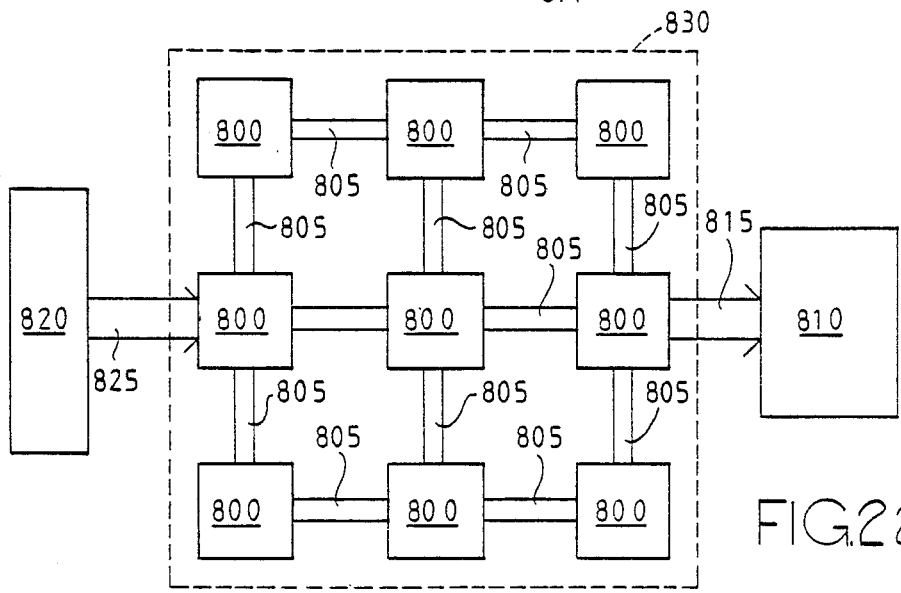

A plural chip system is indicated in FIG. 22 in which each of blocks 800 will comprise a reconfigurable chip, each usually also with an associated RAM. The chips are interconnected at 805 via their above-mentioned input/output provisions, and provision is made for input data from source 820 over bus 825 and for output data to utilisation means 810 over bus 815. Such a chip system is clearly capable of serial processing where the chips are differently configured and of parallel processing where the chips are similarly configured, and of desired combinations of serial and parallel processing. One or more of the chips may be devoted wholly or partly to control purposes, though some host apparatus or system will usually be provided and itself may include the separately indicated signal supply means 820 and utilisation means 810.

It is believed to be advantageous for plural chip systems to be provided on as few printed circuit boards as possible, hence showing dashed outline 830 in FIG. 22. Such boards may contain more, advantageously very many more, reconfigurable chips than are shown in FIG. 22, and may further contain other chips constituting the host system or a part or parts thereof.

Figure 23:
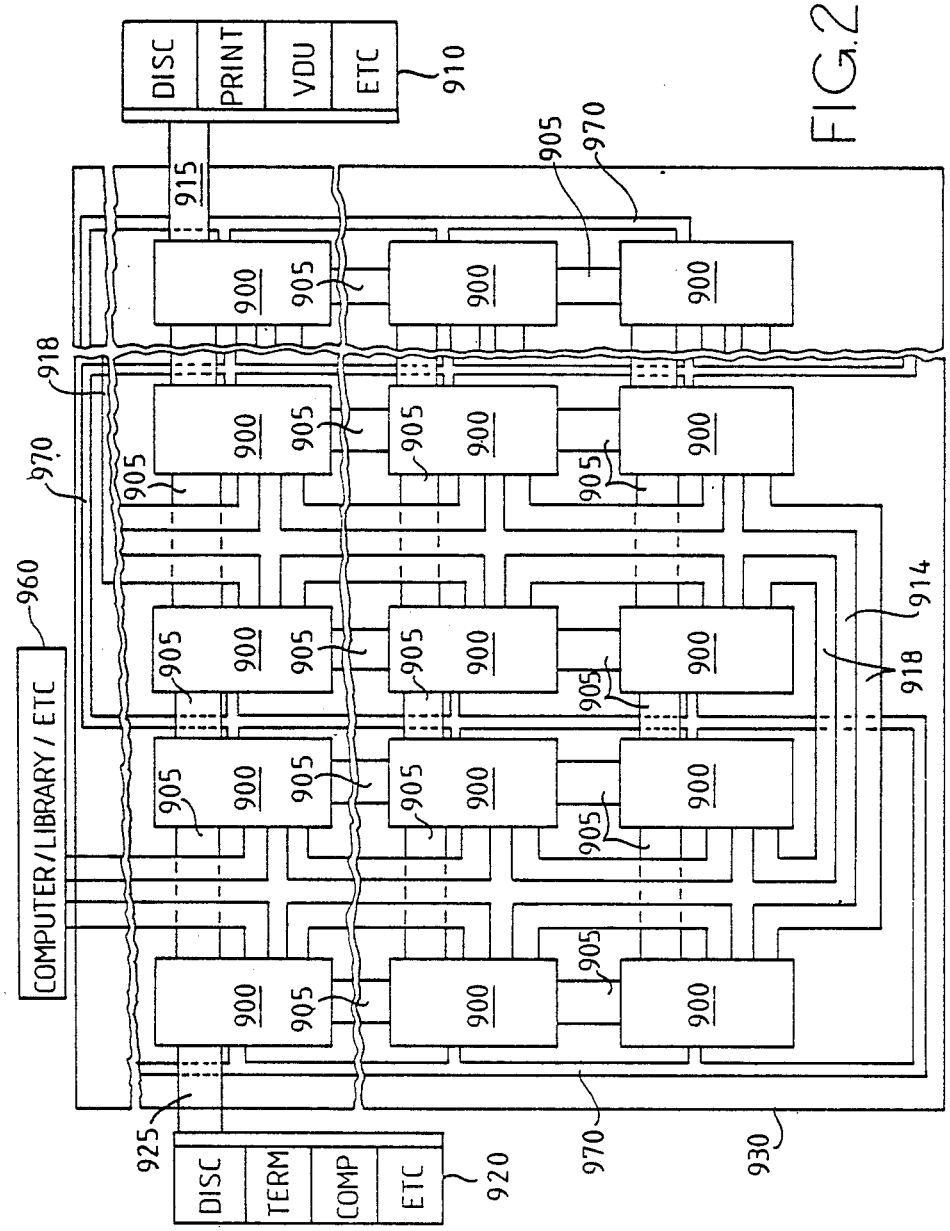
FIG. 23 shows how a plural chip system can be implemented on a printed circuit board.

FIG. 23 shows a preferred printed circuit board 930, which is generally similar to that of FIG. 22 for connections 905 between input/output provisions of its configurable chips, some of which may be used at least partly simply for passing signals between input/output provisions thereof. In addition, however, FIG. 23 shows a configuring address (914) and data (918) bus system for loading RAMs associated with each configurable chip in the manner of FIG. 21, i.e. each block 900 corresponds to FIG. 21. Then, the configuring bus system 914, 918 can identify any block 900 (via a decoder as shown at 640 in FIG. 21) and reload its RAM, if required without any other block 900 to branch chip needing to be disabled. It is even possible to reload RAM of a block 900 without stopping its own chip so long as timing assures no clash with that chip's access requirement to its associated RAM and/or the currently used configuration is either not overwritten or is prewritten to the RAM with accompanying rewriting of the address register of the chip or at least the supply to the lines 630 of FIG. 21.

The configuring bus system 914, 918 is shown coming from an off-board facility 960 constituting a source or library of chip configurations and normally comprising at least a desk-top computer with disc store. That facility 960 may be separate from the source 920 of data (over input bus 925) for processing by the chips of logic blocks 900 and/or from the utilisation means 910 receiving processing results over bus 915, or may be part of an overall computer system including either or both of 910,920. Typical source means 920 will include a disc store with output RAM, and/or a data circuit terminal, and/or a computer system, etc. Similarly, a typical utilisation means 910 will include a disc store and/or a printer and/or a visual display unit, etc.

It will be recalled from FIG. 14 that one configurable chip hereof affords ten input/output pads or pins at each side. Using such chips in the logic blocks 900 of FIG. 23, a conventional 8-bit wide data flow can readily be provided at 905 between logic blocks 900. Other lines could also be so interconnected for inter-block control purposes and/or at least some of them collected into a bus traversing all of the logic blocks 900 for global control and/or logic block addressing purposes, see 970 in FIG. 23.

It will be appreciated that FIG. 23 is not intended to indicate any particular size of board 930 and associated population of logic blocks 900, there being several break lines in FIG. 23. Also, the snaking paths of the configuring bus 914, 918 and global bus 970 could be of other layout, and the configuring address (914) and data (918) buses could be separate rather than superposed. Boards of FIG. 23 could, of course, be connected together into an even larger system, say using a mother-daughter board arrangement.

As data processing apparatus, a system (such as shown in FIG. 23) utilising a plurality of configurable chips has great potential, whether the chips are as in FIGS. 9–19 hereof or otherwise.

The data processing power of the system is demonstratable relative to conventional programmed computer systems. Inherently, every programmed computer deals with program instructions in an essentially sequential manner. That is, of course, why computer simulations of purpose-built electronic apparatus tend to be very slow compared with the actual apparatus simulated. Both of electronic computers and other purpose-built electronic apparatus utilise electronic logic chips, and the comparison in terms of speed is between the speed at which such chips can operate and transfer electric signals between themselves, and the number of cycle times of a computer required to execute the number of program instructions that need to be processed for the simulation. One way to increase data processing capability, in certain suitable circumstances, is to operate component computer subsystems overlapped or in parallel. However each of such subsystems has the same characteristics as any programmed computer, i.e. it operates sequentially on program instructions. Using configurable chips, however, the desired functions can each be set up by configuring the chips whose individual and collective configuration then constitute a special-purpose logic system, which will operate at electronic switching/transmission speeds rather than at speeds related to computer cycle times. However much execution of program instructions can be effectively overlapped and cycle times reduced (as is done for powerful computer systems performing millions of instructions per second), there is still sequentiality, i.e. all program instructions can never be executed simultaneously. In effect, of course, simultaneous performance is what applies for configured chips in a system hereof.

A single reconfigurable chip of the FIG. 11 type using 3-micron CMOS fabrication can have at least 2,000 logic gates, and it should be possible to increase to over 8,000 gates using 1 micron CMOS fabrication. We can achieve utilisation of over 60% of gates on such chips in particular useful configurations. It is possible to calculate a number (N), based on the actual number of executed program instructions required to execute a computer program simulating the chip configuration concerned, and correlated with the cycle times of the computer concerned and the configured chip (say at 5 MHz–15 MHz operation for the latter), so as to express execution time of a simulation program for any particular computer in terms of a multiple of the time taken for a configured chip (i.e. actual logic) to operate.

It is possible to calculate numbers (N1, N2 etc.) for all of the configurable chips of a plural chip system, say of the FIG. 23 type. For M configurable chips operating wholly serially in processing input data according to their individual and collective actual configurations, a programmed computer would take $N1+N2+ \ldots +NM$ times as long as to perform the same function. Moreover, the FIG. 23 system can produce output at every cycle after the Mth. For M chips operating in parallel only one cycle of a FIG. 23 system is required (at least ignoring any requirement to avoid "clashes" between chip outputs, which could be rare in investigation of different parts of a spectrum of data for particular features). Then, the "improvement factor" would approach $M(N1+N2+ \ldots +NM)$, and could not reduce by more than M even if there were continuous "clashes" of chip outputs requiring separate cycles to go to utilisation means.

Importantly, reconfiguration from RAMs associated one with each configurable chip takes only a RAM read time (equivalent to a load or refresh cycle time). Even for reloading RAMs, only a RAM write followed by a RAM read is required, and that can be managed efficiently by rewriting RAMs without interruption of current chip operation as each RAM could contain many configurations (each requiring one binary word per gate of the chip).

It will be apparent that the number N can be converted, for any particular computer comparison, into equivalents to the rate at which instructions are performed by the computer concerned. Systems must as in FIG. 23 can thus represent inexpensive equivalence to very powerful and expensive computers. Effectively, a FIG. 23 system is actual electronic logic for every overall configuration and can be reconfigured by the equivalent of programming.

I claim:

1. A configurable semiconductor integrated circuit which, as-made, comprises an area thereof formed with a plurality of logic circuits at discrete sites, respectively, wherein each said logic circuit is only capable of performing a simple logic function, and wherein each said logic circuit comprises at least one logic circuit input and at least one logic circuit output, and a restricted signal translation system between inputs and outputs of the logic circuits said restricted signal translation system comprising a plurality of direct connection paths each including means by which its conduction state is selectable said direct connection paths extending, for each of said logic circuits, from at least one logic circuit output of the respective logic circuit to selected logic circuits inputs of a first set of some of other said logic circuits, and, for each of said logic circuits, from at least one logic circuit input of the respective logic circuit to selected logic circuit outputs of a second set of some of other said logic circuits, all of the sets (for all of the logic circuits) each being unique.

2. An integrated circuit as claimed in claim 1, wherein each said logic circuit performs a single logic function.

3. An integrated circuit as claimed in claim 2, wherein each of said logic circuits is a two-input NAND logic gate.

4. An integrated circuit according to claim 1 or 2 or 3, wherein some of the inputs and outputs of some of the logic circuits have selectable connection paths extending to input/output means for servicing the plurality of logic circuits, and wherein each of the sets for at least the remainder of said logic circuits comprises at least three other logic circuits.

5. An integrated circuit according to claim 4, wherein, at least for each of those remaining logic circuits, the first and second sets include two said logic circuits in common.

6. An integrated circuit according to claim 4, wherein, at least for some of those remaining logic circuit, each of the first and second sets includes two logic circuits not in common with the other.

7. An integrated circuit according to claim 1, wherein, considering said logic circuits as arranged in rows and columns, each said logic circuit that is in one of the first and second sets of another of said logic circuits but not in the other set is in the same row as said another logic circuit, and, where there are two logic circuits which are in the same row as and are adjacent to said another logic circuits, these two logic circuits are in different ones of the first and second sets of said another logic circuit.

8. An integrated circuit according to claim 7, wherein others of said logic circuits in the same row and in only one of the first and second sets of a said logic circuit are next-but-one to said logic circuit in the same row.

9. An integrated circuit according to claim 1, wherein, considering said logic circuits as arranged in rows and columns, at least one of said logic circuits is in both of the first and second sets of another of said logic circuits, and each of said logic circuits that is in both of the first and second sets of another said logic circuit is next to and in the same column as said another logic circuit.

10. An integrated circuit according to claim 1, wherein, considering said logic circuits as arranged in rows and columns, at least some of said logic circuits that are next adjacent in columns are formed oppositely in that their inputs and outputs are reversed in position.

11. An integrated circuit according to claim 10, wherein the oppositely formed logic circuits alternate in each column but are all similarly formed in each row.

12. An integrated circuit according to claim 1, further comprising another signal translation system having at least one other direct connection path of an extent traversing more of said sites than can be reached via any path of any said set of direct connection paths, and wherein further input connection paths of the logic circuits, and further output connection paths of the logic circuits where present, each also includes means by which its conduction state is selectable, and said further connection paths constitute branches from a said other direct connection path.

13. An integrated circuit according to claim 12, wherein said further input connection paths, and further output connection paths where present, constituting said branches are two per logic circuit, and said other signal translation system has plural said other direct connection paths some extending between rows of a matrix array of said sites and other extending between columns of said sites, said further input connection paths at each such said site, and further output connection paths where present, being branched to a unique corresponding combination of one each of direct connection paths extending between said rows and said other direct connection paths extending between said columns.

14. An integrated circuit according to claim 13, wherein at least some of said other direct connection paths comprise discrete segments.

15. An integrated circuit according to claim 13, wherein direct connection paths extending between said rows and said other direct connection paths extending between said columns are connectable to each other via a said logic circuit for which said unique corresponding combination applies.

16. An integrated circuit according to claim 1, wherein all selectable connection paths each include a circuit element dedicated thereto and whose as-made conduction state can be reversed by application of configuring electrical signals or signal conditions, and wherein each said circuit element has associated further circuitry by which it is conditioned for configuration, and wherein conducting address paths traverse said area for energisation in conditioning the further circuitry of circuit elements to be configured.

17. An integrated circuit according to claim 16, wherein said circuit elements and associated further circuitry for all inputs of each logic circuit, and outputs where selectable, are disposed adjacent to the corresponding logic circuit and included within the corresponding said site.

18. An integrated circuit according to claim 16, further comprising program conducting paths corresponding in number to the number of selectable connection paths at a said site and serving to cause application of said configuring electrical signals in respect of selected said connection paths, and wherein said program conducting paths traverse throughout the logic circuits and are branched into each said site.

19. An integrated circuit according to claim 16, wherein there is coincident-signal operation of said conducting address paths and said conducting address paths are in plural groups and each selectable connection path at each sit has coded connection thereto for generating configuring signal conditions.

20. An integrated circuit according to claim 16, wherein each said circuit element comprises a conducting link that will be rendered irreversibly non-conducting by a said configuring electrical signal applied thereto.

21. An integrated circuit according to claim 20, wherein each said further circuitry includes an active circuit device connected in series with its associated said conducting link, said active circuit device being rendered conducting by signals from said address paths in order to pass a said configuring electrical signal if applied.

22. An integrated circuit according to claim 16, wherein a said circuit element comprises an active circuit component having a conduction control connection, the active circuit component remaining reversible as to its conduction state after application of a said configuring electrical signal.

23. An integrated circuit according to claim 22, wherein the active circuit component comprises a transistor, and wherein each said further circuitry includes an active circuit device connected to the conduction control connection of its associated said active circuit component, said active circuit device being rendered capable of conduction using signals from said address paths so as to provide a configuring electrical signal condition when the active circuit device receives a configuring electrical signal.

24. An integrated circuit according to claim 23, wherein the active circuit device will remain conducting after being rendered conducting by a pulse signal.

25. An integrated circuit according to claim 24, wherein the active circuit device is a field effect transistor of charge-trapping type.

26. An integrated circuit according to claim 22, wherein said active circuit component requires repeated application of said configuring electrical signal in order to maintain its configured conduction state.

27. An integrated circuit according to claim 26, wherein the active circuit component is a field effect transistor relying on its own capacitance to remain adequately conducting between periodic applications of said configuring electrical signal, and its said further circuitry is of field effect switching transistor type.

28. An integrated circuit according to claim 22, wherein the active circuit component is a bipolar transistor and its said further circuitry is of triggerable conduction-state-setting type.

29. An integrated circuit according to claim 28, wherein said further circuitry comprises a bipolar circuit equivalent of two complementary transistors interconnected base-to-collector, and wherein said further circuitry further comprises a bipolar transistor controlling a voltage applied to a said base-to-collector connection and serving for setting a voltage condition required for switching of the further circuitry then setting the active circuit component to conduction.

30. An integrated circuit according to claim 28, wherein the bipolar transistor constituting the active circuit component is an input stage for a NAND logic gate transistor whose control electrode is connected in the emitter-collector circuit of said bipolar transistor.

31. An integrated circuit according to claim 1, wherein each logic circuit is a single-output logic gate for performing a single inverting logic function.

32. An integrated circuit according to claim 31, wherein the logic circuits each have a lesser number of operative inputs than there are selectable said connecting paths for input purposes, and those selectable connecting paths are in groups each connected to a different operative input for selection of one said path of any group relative to the corresponding operative input.

33. An integrated circuit according to claim 32, wherein at least one of the selectable connecting paths for input purposes is in more than one said group.

34. An integrated circuit according to claim 1, further comprising input-output circuitry formed with connections to logic circuit inputs and outputs extending from said area, said input-output circuitry comprising cells each servicing a different side of a matrix array of said logic circuits.

35. An integrated circuit according to claim 34, wherein each cell comprises subcells configurable between first and second states in which signals can go to logic circuit inputs or come from logic circuit inputs, respectively.

36. An integrated circuit according to claim 35, wherein subcells connected to outputs of edge-most ones of an array of the logic cells are further connected to inputs of the next ones of the logic circuits.

37. An integrated circuit according to claim 35, wherein each said subcell is connected to a unique group of logic circuit inputs and outputs and there are fewer subcells than serviced logic circuit inputs and outputs.

38. An integrated circuit according to claim 35, further comprising conducting paths interconnecting chip connections of selected subcells on two adjacent sides of the array.

39. An integrated circuit according to claim 1 wherein any two of said sets each has at least one of said logic circuits not in the other of those two sets.

40. An integrated circuit according to claim 1 wherein none of said sets includes all of the logic circuits of any other of said sets.

41. An integrated circuit according to claim 1 wherein the first and second sets are different for each said logic circuit, and wherein all of the sets included in all of the first and second sets are different from each other.

42. An electronic system comprising a reconfigurable semiconductor integrated circuit having a plurality of logic circuits for which alternative configurations involving selection of different interconnections for operative conduction relative to inputs and outputs of the logic circuits enable different performance of some overall system function to generate processing signals, wherein each said logic circuit is only capable of performing a simple logic function, means for presenting to the reconfigurable integrated circuit configuration-defining signals, means in the reconfigurable integrated circuit responsive to the configuration-defining signals to select and thus adopt a desired reconfigurable configuration, and means for utilising processing signals from the reconfigurable integrated circuit.

43. A system according to claim 42, wherein the means for presenting includes a store system readable to provide said configuration representative signals on an alternative basis for each of different configurations, and further comprising means for addressing the store system according to which configuration is required.

44. A system according to claim 42, comprising a plurality of said reconfigurable integrated circuits with bus signal translation provision between them for serial/parallel processing in relation to overall system function.

45. A system according to claim 44, wherein each reconfigurable integrated circuit has its own storage means for configuration data.

46. A system according to claim 45, comprising further signal translation provision for addressing and writing configuration data to each store.

* * * * *